United States Patent
Yokomizo et al.

(10) Patent No.: US 11,569,139 B2
(45) Date of Patent: Jan. 31, 2023

(54) ELECTRICAL OVERLAY MEASUREMENT METHODS AND STRUCTURES FOR WAFER-TO-WAFER BONDING

(71) Applicant: WESTERN DIGITAL TECHNOLOGIES, INC., San Jose, CA (US)

(72) Inventors: Ikue Yokomizo, Nagoya (JP); Michiaki Sano, Ichinomiya (JP); Kazuto Watanabe, Nagoya (JP); Hajime Yamamoto, Nagoya (JP); Takashi Yamaha, Obu (JP); Koichi Ito, Yokkaichi (JP); Katsuya Kato, Yokkaichi (JP); Ryo Hiramatsu, Yokkaichi (JP); Hiroshi Sasaki, Nagoya (JP); Akihiro Tobioka, Nagoya (JP); Liang Li, Shanghai (CN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 17/194,636

(22) Filed: Mar. 8, 2021

(65) Prior Publication Data
US 2022/0285234 A1 Sep. 8, 2022

Related U.S. Application Data

(63) Continuation of application No. 17/189,548, filed on Mar. 2, 2021.

(51) Int. Cl.
*H01L 23/544* (2006.01)
*H01L 23/528* (2006.01)
(Continued)

(52) U.S. Cl.
CPC .............. *H01L 22/34* (2013.01); *H01L 22/12* (2013.01); *H01L 24/89* (2013.01); *H01L 2224/08145* (2013.01); *H01L 2224/80895* (2013.01)

(58) Field of Classification Search
CPC .............. H01L 25/0657; H01L 23/544; H01L 2223/54426; H01L 2224/80895; H01L 22/14
See application file for complete search history.

(56) References Cited

U.S. PATENT DOCUMENTS 5,915,167 A 6/1999 Leedy
6,013,952 A * 1/2000 Chan ................... H01L 23/5226
257/784

(Continued)

FOREIGN PATENT DOCUMENTS

| CN | 108511419 A | 9/2018 |
| KR | 10-20150005199 A | 1/2015 |
| WO | WO2012/015550 A2 | 2/2012 |

OTHER PUBLICATIONS

Notification of Transmittal of the International Search Report and the Written Opinion of the International Searching Authority for International Patent Application No. PCT/US2021/034789, dated Nov. 30, 2021, 15 pages.

(Continued)

*Primary Examiner* — Bradley Smith
*Assistant Examiner* — David J Goodwin
(74) *Attorney, Agent, or Firm* — The Marbury Law Group PLLC

(57) ABSTRACT

A method includes providing a first wafer including a respective set of first metal bonding pads and at least one first alignment diagnostic structure, providing a second wafer including a respective set of second metal bonding pads and a respective set of second alignment diagnostic (Continued)

structures, overlaying the first wafer and the second wafer, measuring at least one of a current, voltage or contact resistance between the first alignment diagnostic structures and the second alignment diagnostic structures to determine an overlay offset, and bonding the second wafer to the first wafer.

3 Claims, 30 Drawing Sheets

(51) Int. Cl.
    *H01L 21/66*     (2006.01)
    *H01L 23/00*     (2006.01)

(56) References Cited

U.S. PATENT DOCUMENTS

| | | | |
|---|---|---|---|
| 6,362,638 B1* | 3/2002 | Ashton | G01R 31/66 |
| | | | 324/762.02 |
| 8,102,064 B2* | 1/2012 | Renn | H01L 25/50 |
| | | | 257/797 |
| 8,928,159 B2* | 1/2015 | Chang | H01L 23/481 |
| | | | 257/737 |
| 9,671,215 B2* | 6/2017 | Farooq | G01B 7/31 |
| 10,115,681 B1 | 10/2018 | Ariyoshi | |
| 10,283,493 B1 | 5/2019 | Nishida | |
| 10,354,980 B1 | 7/2019 | Mushiga et al. | |
| 10,354,987 B1 | 7/2019 | Mushiga et al. | |
| 10,381,322 B1 | 8/2019 | Azuma et al. | |
| 10,381,362 B1 | 8/2019 | Cui et al. | |
| 10,504,852 B1* | 12/2019 | Chen | H01L 25/0657 |
| 10,510,738 B2 | 12/2019 | Kim et al. | |
| 10,629,616 B1 | 4/2020 | Kai et al. | |
| 10,665,580 B1 | 5/2020 | Hosoda et al. | |
| 10,665,581 B1 | 5/2020 | Zhou et al. | |
| 10,714,497 B1 | 7/2020 | Nishida et al. | |
| 10,727,216 B1 | 7/2020 | Kai et al. | |
| 10,741,535 B1 | 8/2020 | Nishikawa et al. | |
| 10,790,296 B1 | 9/2020 | Yamaha et al. | |
| 10,797,035 B1 | 10/2020 | Sano et al. | |
| 10,797,062 B1 | 10/2020 | Nishikawa et al. | |
| 10,804,202 B2 | 10/2020 | Nishida | |
| 10,854,573 B2 | 12/2020 | Ji et al. | |
| 10,879,260 B2 | 12/2020 | Uryu et al. | |
| 2008/0258309 A1 | 10/2008 | Chiou et al. | |
| 2010/0258951 A1 | 10/2010 | Gabara | |
| 2011/0156284 A1* | 6/2011 | Zhang | H01L 22/14 |
| | | | 257/E23.179 |
| 2012/0187530 A1* | 7/2012 | Zhang | H01L 27/0694 |
| | | | 257/532 |
| 2013/0249085 A1 | 9/2013 | Ide | |
| 2014/0065738 A1 | 3/2014 | Bhoovaraghan et al. | |
| 2016/0172296 A1 | 6/2016 | Lim et al. | |
| 2017/0011996 A1 | 1/2017 | Lee et al. | |
| 2017/0133282 A1 | 5/2017 | Wu et al. | |
| 2019/0221557 A1 | 7/2019 | Kim et al. | |
| 2019/0252361 A1 | 8/2019 | Nishida | |
| 2020/0066745 A1 | 2/2020 | Yu et al. | |
| 2020/0159133 A1* | 5/2020 | Yan | H01L 23/5283 |
| 2021/0066143 A1 | 3/2021 | Jung | |
| 2021/0066145 A1* | 3/2021 | Kim | H01L 22/34 |
| 2021/0066171 A1* | 3/2021 | Kim | H01L 24/09 |
| 2021/0134685 A1* | 5/2021 | Chen | H01L 24/03 |

OTHER PUBLICATIONS

Notification of Transmittal of the International Search Report and Written Opinion of the International Search Authority for International Patent Application No. PCT/US2020/036948, dated Dec. 15, 2020, 11 pages.

U.S. Appl. No. 16/231,752, filed Dec. 24, 2018, SanDisk Technologies LLC.
U.S. Appl. No. 16/249,423, filed Jan. 16, 2019, SanDisk Technologies LLC.
U.S. Appl. No. 16/269,301, filed Feb. 6, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/391,632, filed Apr. 23, 2019, SanDisk Technologies LLC.
U.S. Appl. No. 16/440,183, filed Jun. 13, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/552,089, filed Aug. 27, 2019, SanDisk Technologies LLC.
U.S. Appl. No. 16/589,404, filed Oct. 1, 2019, SanDisk Technologies LLC.
U.S. Appl. No. 16/660,177, filed Oct. 22, 2019, SanDisk Technologies LLC.
U.S. Appl. No. 16/666,522, filed Oct. 29, 2019, SanDisk Technologies LLC.
U.S. Appl. No. 16/671,025, filed Oct. 31, 2019, SanDisk Technologies LLC.
U.S. Appl. No. 16/682,848, filed Nov. 13, 2019, SanDisk Technologies LLC.
U.S. Appl. No. 16/694,340, filed Nov. 25, 2019, SanDisk Technologies LLC.
U.S. Appl. No. 16/694,400, filed Nov. 25, 2019, SanDisk Technologies LLC.
U.S. Appl. No. 16/694,438, filed Nov. 25, 2019, SanDisk Technologies LLC.
U.S. Appl. No. 16/722,745, filed Dec. 20, 2019, SanDisk Technologies LLC.
U.S. Appl. No. 16/722,824, filed Dec. 20, 2019, SanDisk Technologies LLC.
U.S. Appl. No. 16/728,327, filed Dec. 27, 2019, SanDisk Technologies LLC.
U.S. Appl. No. 16/742,213, filed Jan. 14, 2020, SanDisk Technologies LLC.
U.S. Appl. No. 16/747,943, filed Jan. 21, 2020, SanDisk Technologies LLC.
U.S. Appl. No. 16/774,446, filed Jan. 28, 2020, SanDisk Technologies LLC.
U.S. Appl. No. 16/806,087, filed Mar. 2, 2020, SanDisk Technologies LLC.
U.S. Appl. No. 16/825,304, filed Mar. 20, 2020, SanDisk Technologies LLC.
U.S. Appl. No. 16/825,397, filed Mar. 20, 2020, SanDisk Technologies LLC.
U.S. Appl. No. 17/189,548, filed Mar. 2, 2021, Western Digital Technologies, Inc.
USPTO Office Communication, Non-Final Office Action for U.S. Appl. No. 17/189,548, dated Aug. 10, 2022, 26 pages.

* cited by examiner

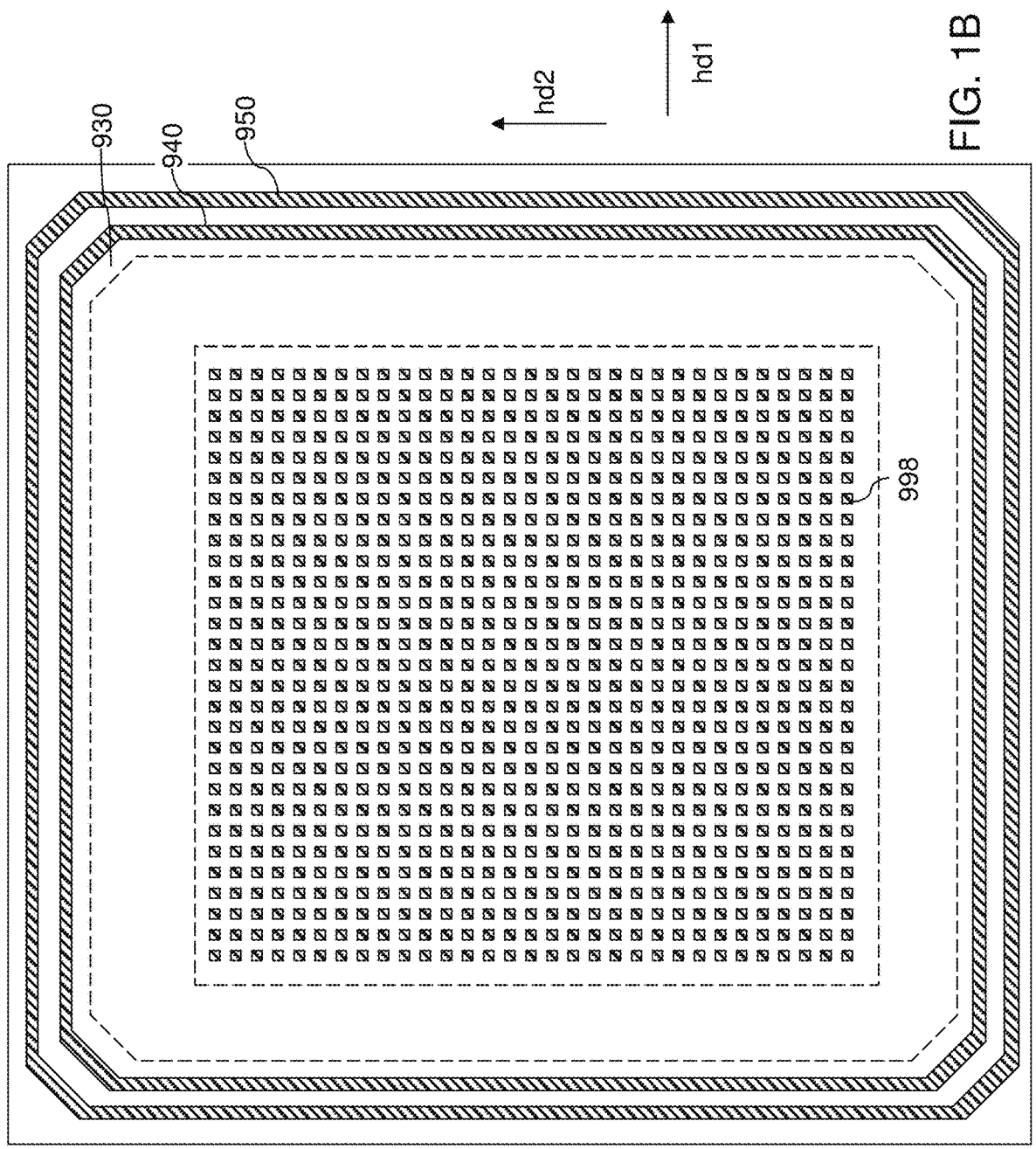

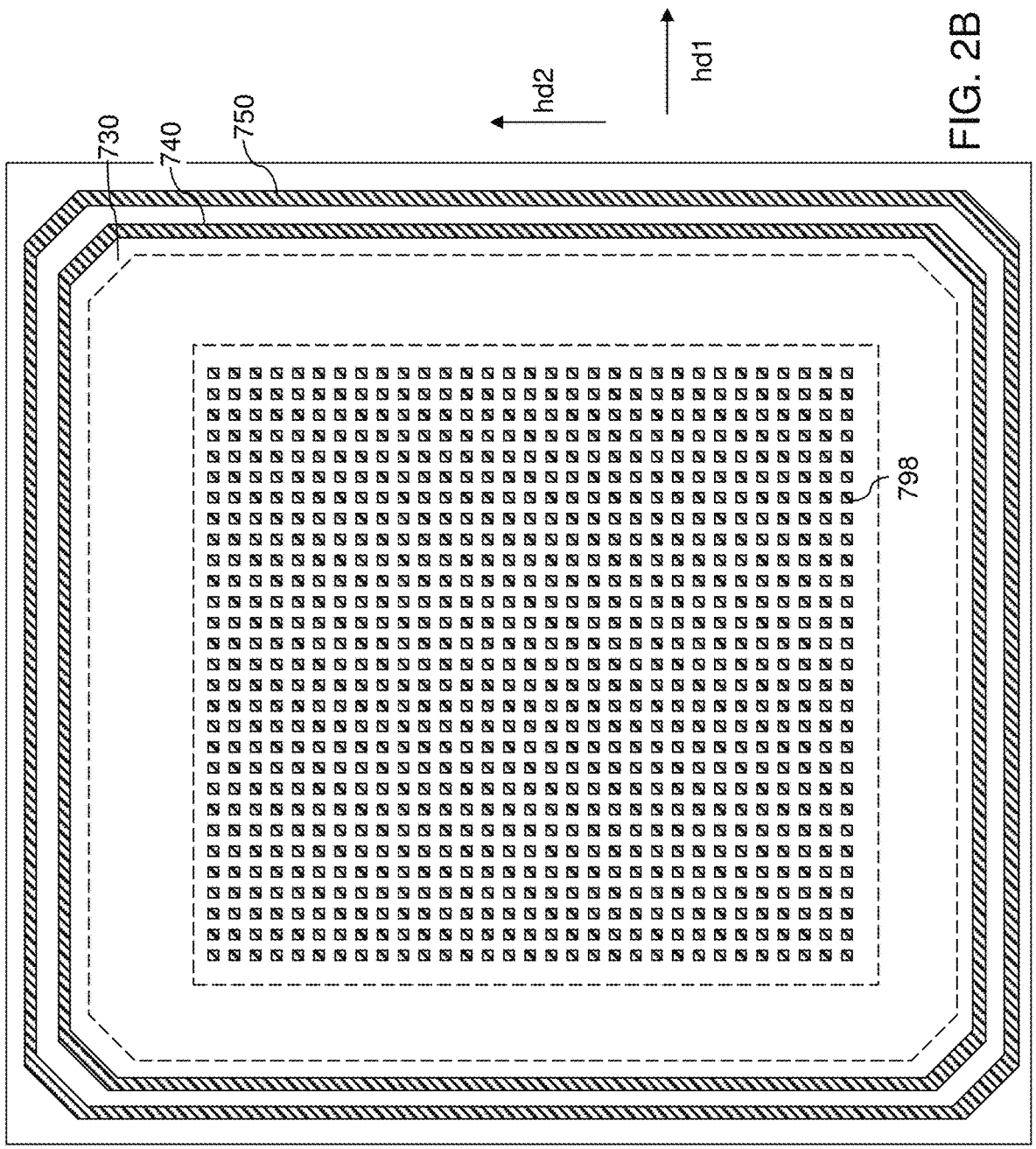

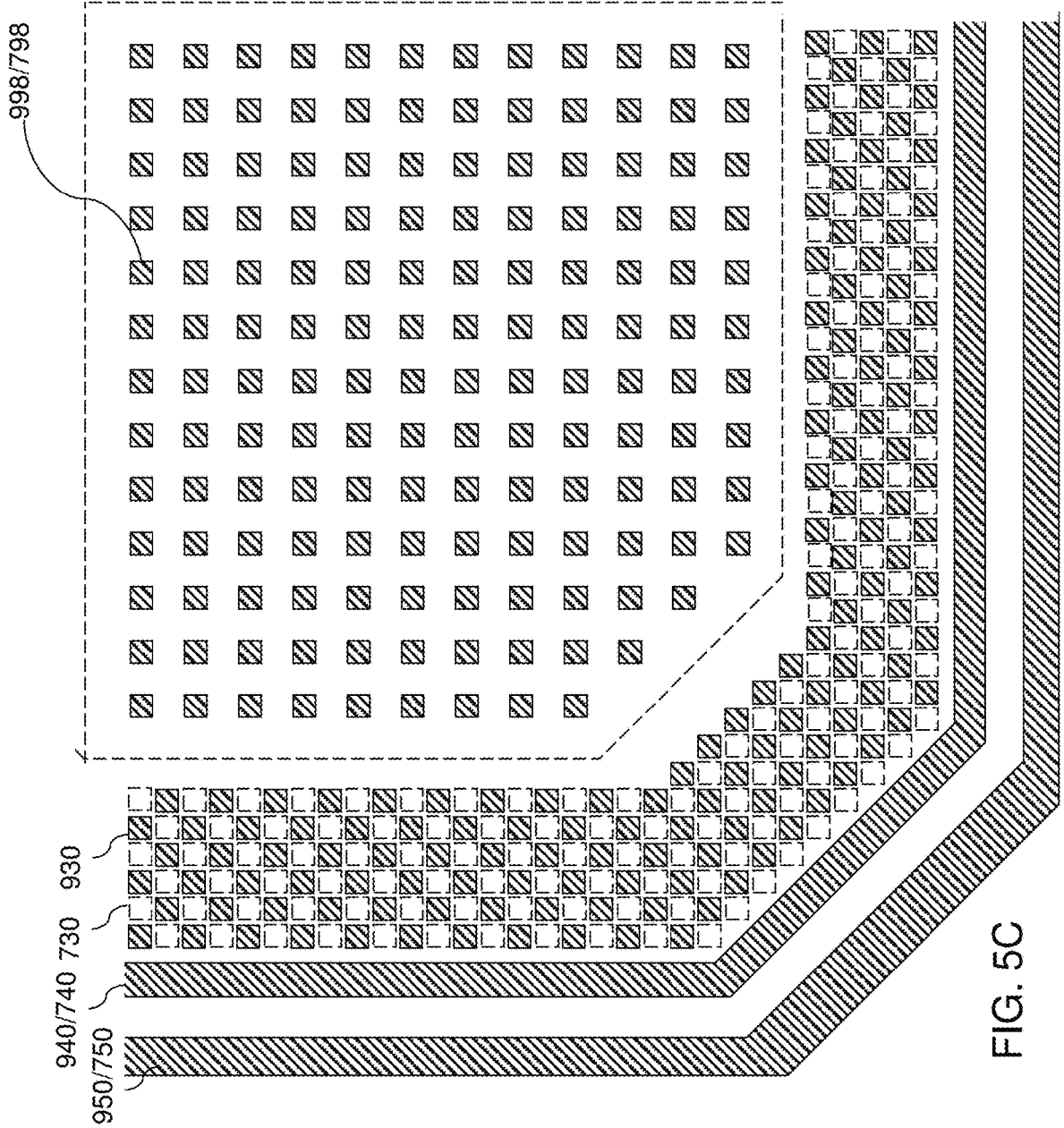

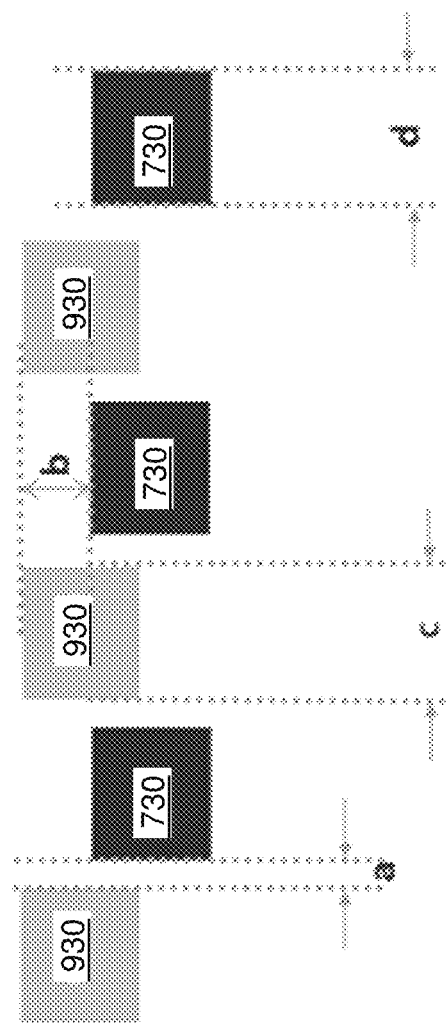

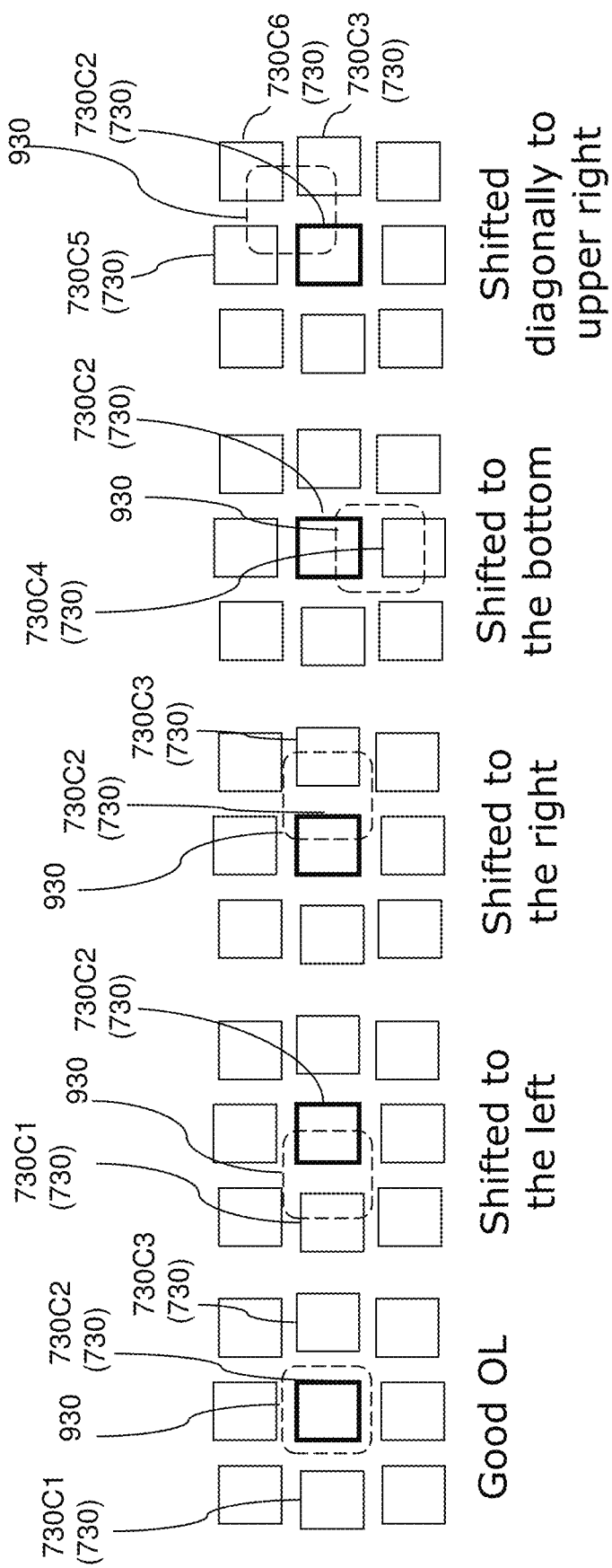

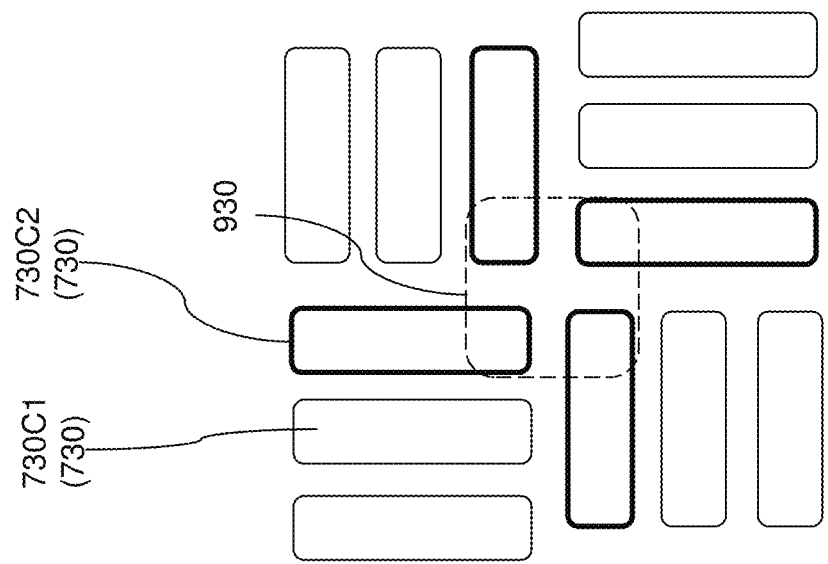
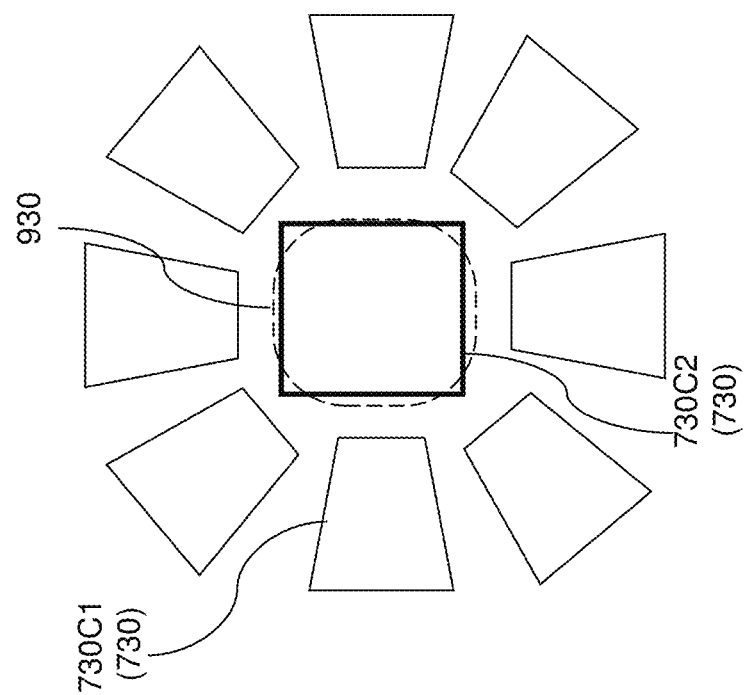
FIG. 12B
FIG. 12A

US 11,569,139 B2

ELECTRICAL OVERLAY MEASUREMENT METHODS AND STRUCTURES FOR WAFER-TO-WAFER BONDING

FIELD

The present disclosure relates generally to the field of semiconductor devices, and particularly to semiconductor structures including electrical overlay measurement structures for wafer-to-wafer bonding, and methods for using the same.

BACKGROUND

Wafer-to-wafer bonding can be employed to enable low-cost mass production of bonded semiconductor chips. However, misalignment between a bonded pair of wafers can lead to high yield loss for the bonded semiconductor chips. Further, misalignment during the wafer-to-wafer bonding process can produce a significant number of bonded semiconductor chips that fail in the field due to high overlay offsets that may be locally induced due to wafer warpage even if the overall overlay between the bonded pair of wafers is within the overlay tolerance limit.

SUMMARY

According to an aspect of the present disclosure, a method comprises providing a first wafer including a first two-dimensional array of first semiconductor dies, wherein each of the first semiconductor dies comprises a respective set of first metal bonding pads and at least one first alignment diagnostic structure located at a same level as the first metal bonding pads, providing a second wafer including a second two-dimensional array of second semiconductor dies, wherein each of the second semiconductor dies comprises a respective set of second metal bonding pads and a respective set of second alignment diagnostic structures located at a same level as the second metal bonding pads, overlaying the first wafer and the second wafer, measuring at least one of a current, voltage or contact resistance between the first alignment diagnostic structures and the second alignment diagnostic structures for multiple mating pairs of the first semiconductor dies and the second semiconductor dies to determine an overlay offset between the mating pairs of the first semiconductor dies and the second semiconductor dies, and bonding the second wafer to the first wafer.

According to another aspect of the present disclosure, a method of bonding a first wafer and a second wafer comprises providing a first wafer including a first two-dimensional array of first semiconductor dies, wherein each of the first semiconductor dies comprises a respective set of first metal bonding pads and a first alignment diagnostic structure located at a same level as the first metal bonding pads, providing a second wafer including a second two-dimensional array of second semiconductor dies, wherein each of the second semiconductor dies comprises a respective set of second metal bonding pads and a respective set of second alignment diagnostic structures comprising a central alignment diagnostic structure and peripheral alignment diagnostic structures that surround the central alignment diagnostic structure, wherein the second alignment diagnostic structures are located at a same level as the second metal bonding pads, overlaying the first wafer and the second wafer, applying opposite polarity current or voltage between the first alignment diagnostic structure and the central alignment diagnostic structure to electrostatically attract the first alignment diagnostic structure and the central alignment diagnostic structure, applying a same polarity current or voltage between the first alignment diagnostic structure and the peripheral alignment diagnostic structures to electrostatically repel the first alignment diagnostic structure from the peripheral alignment diagnostic structure, and bonding the second wafer to the first wafer.

According to an aspect of the present disclosure, a bonded assembly comprises a first semiconductor die and a second semiconductor die. The first semiconductor die comprises first semiconductor devices, first metal bonding pads located on a front surface of the first semiconductor die, and first alignment diagnostic structures located at a same level as the first metal bonding pads. The second semiconductor die comprises second semiconductor devices, second metal bonding pads that are located on a front surface of the second semiconductor die and bonded to the first metal bonding pads by metal-to-metal bonding, and second alignment diagnostic structures located at a same level as the second metal bonding pads. The first alignment diagnostic structures and the second alignment diagnostic structures are connected in a cross-bridge Kelvin pattern.

BRIEF DESCRIPTION OF THE DRAWINGS

FIG. 1B is a top-down view of the first exemplary semiconductor die of FIG. 1A according to the first embodiment of the present disclosure.

FIG. 2B is a top-down view of the second exemplary semiconductor die of FIG. 2A according to the second embodiment of the present disclosure.

FIG. 5C is a plan view of the first exemplary structure or the second exemplary structure in which bonding-level structures are illustrated.

FIG. 5G schematically illustrates parameters that may be employed to optimize patterns for alignment diagnostics structures according to an embodiment of the present disclosure.

FIGS. 11A, 11B, 11C, 11D and 11E illustrate schematic diagrams for alignment diagnostic structures for various overlay conditions.

FIGS. 12A and 12B illustrate alternative geometries for the alignment diagnostic structures according to embodiments of the present disclosure.

DETAILED DESCRIPTION

Figure 1A:
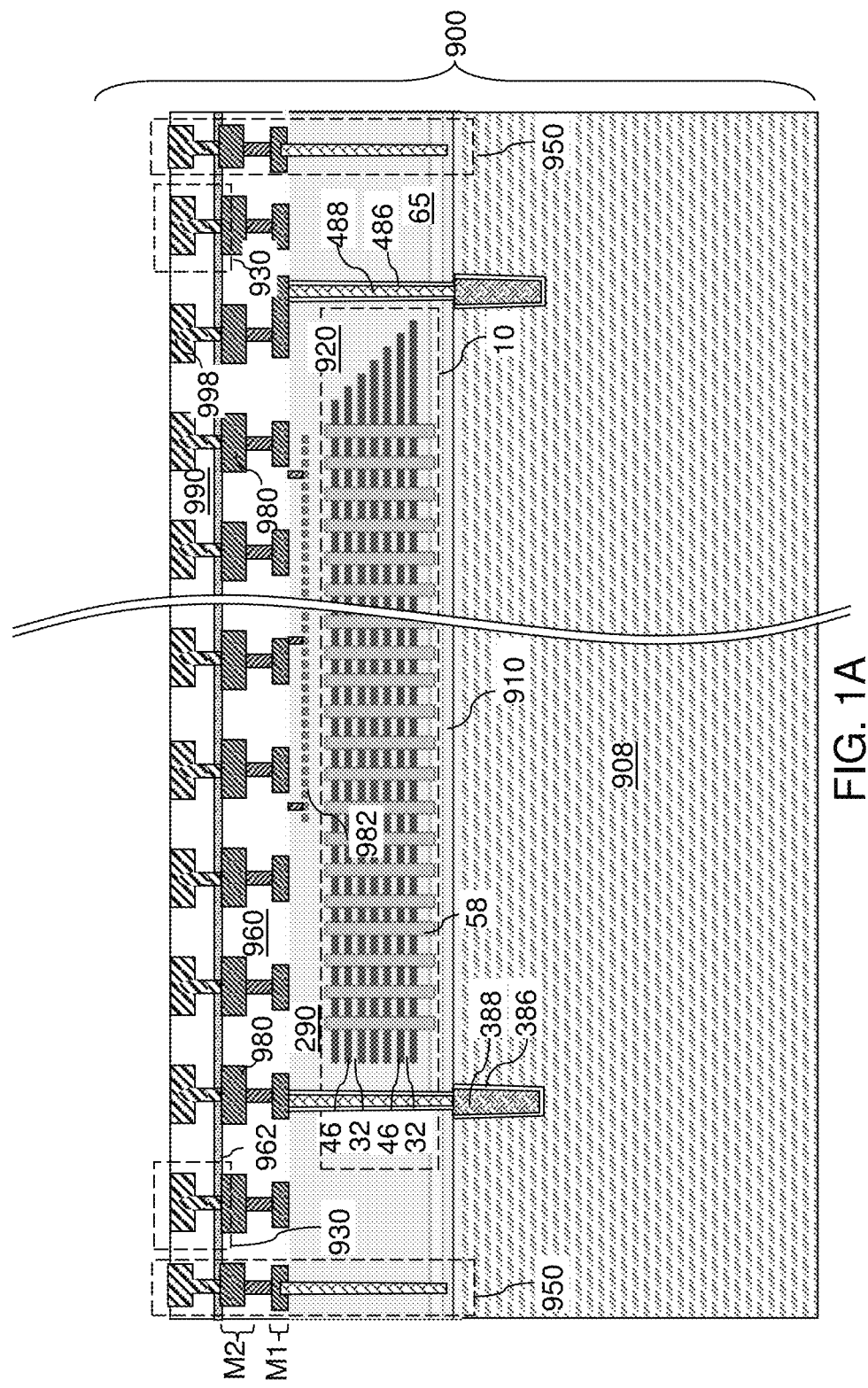
FIG. 1A is a schematic vertical cross-sectional view of a first exemplary semiconductor die according to a first embodiment of the present disclosure.

As discussed above, the embodiments of the present disclosure are directed to semiconductor structures including electrical overlay measurement structures for wafer-to-wafer bonding, and methods and apparatus for using the same. The various aspects of embodiments of the present disclosure are described in detail herebelow.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1C:
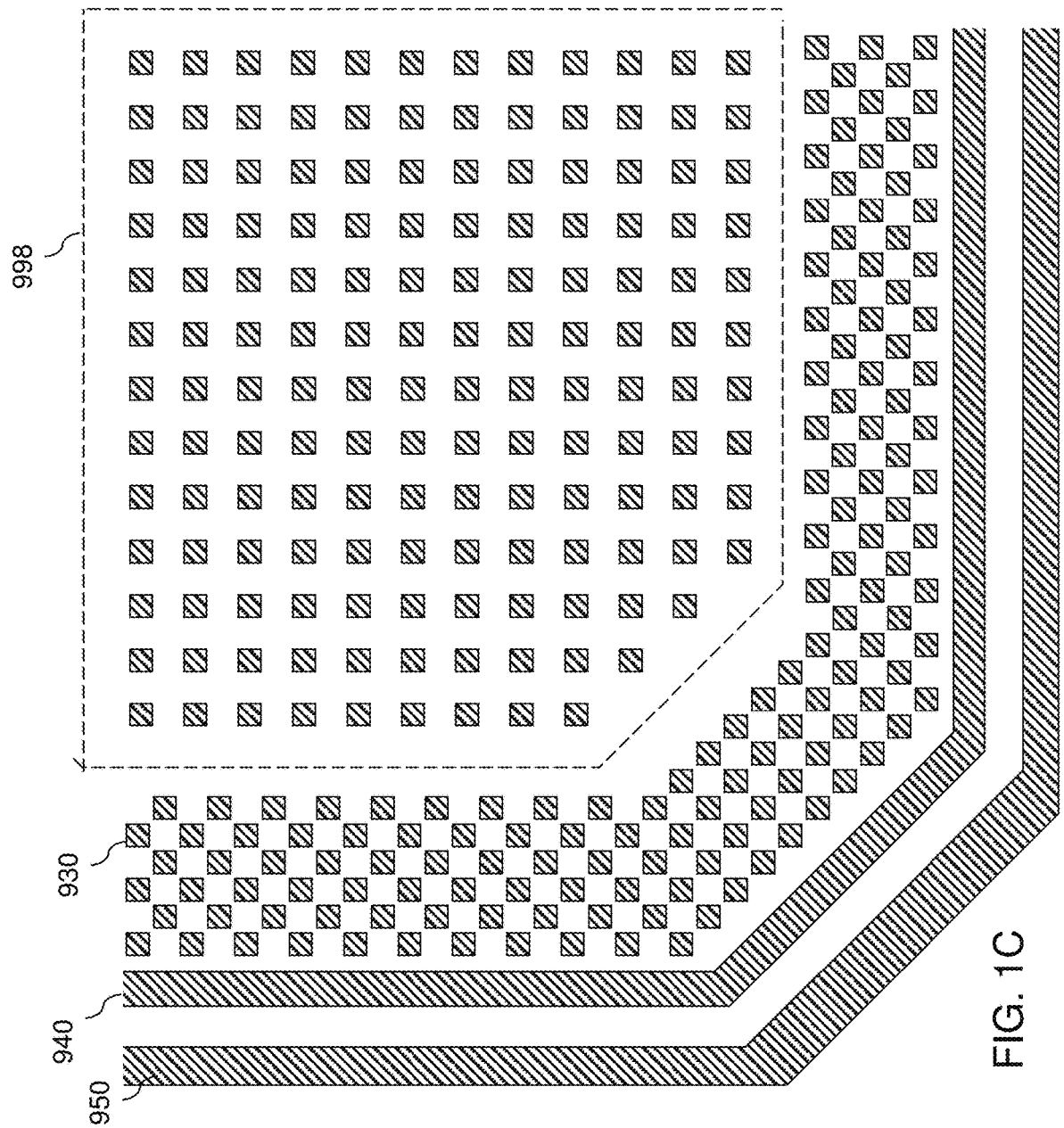
FIG. 1C is a magnified view of a region of the top-down view of FIG. 1B.

Referring to FIGS. 1A-1C, a first semiconductor die 900 is illustrated. The first semiconductor die 900 may be provided as one of the first semiconductor dies 900 within a first wafer (e.g., substrate) 908 that includes a two-dimensional array of first semiconductor dies 900. While only a single first semiconductor die 900 is illustrated herein, it is understood that a first wafer including a two-dimensional array of first semiconductor dies 900 may be manufactured employing standard semiconductor manufacturing processes. The first semiconductor die 900 includes a first substrate 908, first semiconductor devices 920 overlying the first substrate 908, first interconnect-level dielectric material layers (290, 960) located on the first semiconductor devices, and first metal interconnect structures 980 embedded in the first interconnect-level dielectric material layers (290, 960). In one embodiment, the first substrate 908 may be a first substrate such as a commercially available silicon wafer having a thickness in a range from 500 microns to 1 mm.

Discrete substrate recess cavities can be formed in an upper portion of the first substrate 908 by applying a photoresist layer over the top surface of the first substrate 908, lithographically patterning the photoresist layer to form an array of discrete openings, and transferring the pattern of the array of discrete openings into the upper portion of the first substrate by performing an anisotropic etch process. The photoresist layer can be subsequently removed, for example, by ashing. The depth of each discrete substrate recess cavity can be in a range from 500 nm to 10,000, although lesser and greater depths can also be employed. A through-substrate liner 386 and a through-substrate via structure 388 can be formed within each discrete substrate recess cavity. The through-substrate via structure 388 may comprise a through silicon via, a contact pad or any other suitable structure. Alternatively, the through-substrate liner 386 and the through-substrate via structure 388 can be omitted.

Generally, the first semiconductor devices 920 may comprise any semiconductor device known in the art. In one embodiment, the first semiconductor die 900 comprises a memory die, and may include memory devices, such as a three-dimensional NAND memory device. In an illustrative example, the first semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46.

Dielectric material portions 65 may be formed around each vertically alternating stack (32, 46) to provide electrical isolation between neighboring vertically alternating stacks (32, 46).

Through-memory-level via cavities can be formed through the dielectric material portions 65, the optional dielectric spacer layer 910, and the horizontal semiconductor channel layer 10. An optional through-memory-level dielectric liner 486 and a through-memory-level via structure 488 can be formed within each through-memory-level via cavity. Each through-memory-level dielectric liner 486 includes a dielectric material such as silicon oxide. The through-substrate via structure 488 may comprise a through silicon via, a contact pad or any other suitable structure. Alternatively, the through-substrate liner 486 and the through-substrate via structure 488 can be omitted.

The first interconnect-level dielectric material layers (290, 960) may include first proximal interconnect-level dielectric material layers 290 embedding contact via structures and bit lines 982 and first distal interconnect-level dielectric material layers 960 that embed a subset of the first metal interconnect structures 980 located above the first proximal interconnect-level dielectric material layers 290. As used herein, a "proximal" surface refers to a surface that is close to a substrate, and a "distal" surface refers to a surface that is distal from the substrate. In the first semiconductor die 900, a proximal surface refers to a surface that is close to the first substrate 908, and a distal surface refers to a surface that is distal from the first substrate 908.

The bit lines 982 are a subset of the first metal interconnect structures 980 and may electrically contact drain regions located above the semiconductor channel at the top of the memory opening fill structures 58. The contact via structures contact various nodes of the first semiconductor devices. Generally, the first metal interconnect structures 980 can be electrically connected to the first semiconductor devices 920. A proximal subset of the first metal interconnect structures 980 can be located within the first distal interconnect-level dielectric material layers 960. Interconnect metal lines and interconnect metal via structures, which are subsets of the first metal interconnect structures 980, can be embedded in the first distal interconnect-level dielectric material layers 960. In an illustrative example, the first metal interconnect structures 980 may include a first memory-side metal level M1 including memory-side first-level metal lines, and a second memory-side metal level M2 including memory-side second-level metal lines.

Each of the first proximal interconnect-level dielectric material layers 290 and the first distal interconnect-level dielectric material layers 960 may include a dielectric material such as undoped silicate glass, a doped silicate glass, organosilicate glass, silicon nitride, a dielectric metal oxide, or a combination thereof. A first dielectric diffusion barrier layers 962 may be formed over the first interconnect-level dielectric material layers (290, 960). The first dielectric diffusion barrier layer 962 may include silicon carbon nitride (i.e., silicon carbonitride "SiCN", which is also referred to silicon carbide nitride), silicon nitride ($Si_3N_4$), silicon oxynitride, or any other dielectric material that is effective in blocking diffusion of copper. In one embodiment, the first dielectric diffusion barrier layer 962 may include a dielectric material having a dielectric constant less than 5, such as SiCN having a dielectric constant of about 3.8, to reduce RC delay of the first metal interconnect structures 980.

A first bonding-level dielectric layer 990 may be formed over the first dielectric diffusion barrier layer 962. The first bonding-level dielectric layer 990 may include a dielectric material that can provide dielectric-to-dielectric bonding. In one embodiment, the first bonding-level dielectric layer 990 may include undoped silicate glass or a doped silicate glass. The thickness of the first bonding-level dielectric layer 990 may be in a range from 500 nm to 5,000 nm, such as from 1,000 nm to 3,000 nm, although lesser and greater thicknesses may also be employed.

Pad cavities can be formed through the first bonding-level dielectric layer 990, for example, by forming a patterned photoresist layer over the first bonding-level dielectric layer 990 and transferring the pattern in the patterned photoresist layer into the first bonding-level dielectric layer 990 at least once. The pad cavities include bonding pad cavities in which first metallic bonding pads are subsequently employed for metal-to-metal bonding, and overlay diagnostic pad cavities in which first alignment diagnostic structures are subsequently formed. The boding pad cavities may be arranged as a two-dimensional periodic or non-periodic array. The pattern of the overlay diagnostic bonding cavities are subsequently described in detail.

In one embodiment, each of the pad cavities may have a uniform depth. In another embodiment, each of the pad cavities may have an upper pad volume and at least one downward-extending via portions that vertically extends downward from the upper pad volume. A top surface of a respective one of the first metal interconnect structures 980 can be physically exposed at the bottom of each pad cavity. At least one metallic material can be deposited in the pad cavities, and excess portions of the at least one metallic material can be removed from above the horizontal plane including the top surface of the first bonding-level dielectric layer 990 by a planarization process such as a chemical mechanical polishing process. In one embodiment, the at least one metallic material may include a metallic nitride liner material (such as TiN, TaN, or WN) and a metallic fill material (such as Cu) that can provide metal-to-metal bonding. Each remaining portion of the at least one conductive material filling the pad cavities constitute first metal bonding pads 998. Each of the first metal bonding pads 998 can be electrically connected to a respective electrical node of the first semiconductor devices 920 through a respective subset of the first metal interconnect structures 980, or to a respective one of the through-substrate via structures 388 through a respective subset of the first metal interconnect structures 980. Each remaining portion of the at least one conductive material filling the overlay diagnostic bonding cavities comprises a first alignment diagnostic structure 930. In one embodiment, pairs of the first alignment diagnostic structures 930 may be electrically connected among one another through a respective subset of the first metal interconnect structures 980, and may be electrically isolated from the first semiconductor devices 920. For example, each electrically connected subset of two or more of the first alignment diagnostic structures 930 or each electrically connected subset of two or may be electrically connected to each other through a respective subset of the first metal interconnect structures 980. The first alignment diagnostic structures 930 may comprise electrically conductive (e.g., copper, etc.) pads.

In one embodiment, the first alignment diagnostic structures 930 can be located around an array of first metal bonding pads 988 in first semiconductor die 900, as schematically illustrated in FIGS. 1B and 1C. In one embodiment, a first edge seal structure 950 can laterally extend along a periphery of each first semiconductor die 900 to provide a metallic diffusion barrier structure that protects the first semiconductor dies 900 from ingress of moisture and/or impurity atoms. The first edge seal structure 950 can continuously extend from a top surface of the first substrate 908 to the top surface of the first bonding-level dielectric layer 990 without any lateral opening therethrough. In one embodiment, the first alignment diagnostic structures 930 may be formed between the array of first metal bonding pads 988 and the first edge seal structure 950, and may laterally surround the array of first metal bonding pads 988. In one embodiment, the first metal bonding pads 988 may be arranged as a rectangular periodic array having a first periodicity along a first horizontal direction hd1 and having a second periodicity along a second horizontal direction hd2 that is perpendicular to the first horizontal direction hd1. Each of the first periodicity and the second periodicity may be in a range from 500 nm to 100 microns, such as from 1 micron to 50 microns. In one embodiment, one or more optional additional ring-shaped edge seal structures 940 can be nested inside the first edge seal ring structure 950 in the first semiconductor die 900, as shown in FIGS. 1B and 1C.

In one embodiment, the first alignment diagnostic structures 930 may include square metallic pad structures or rectangular metallic pad structures that are arranged in a checkerboard pattern such that corners of the first alignment diagnostic structures 930 do not contact one another. In one embodiment, corners of the first alignment diagnostic structures 930 may be rounded with a radius of curvature in a range from 5 nm to 300 nm. The lateral distance between parallel pairs of straight sidewalls of each first alignment diagnostic structure 930 may be in a range from 100 nm to 10,000 nm, such as from 300 nm to 3,000 nm, although lesser and greater lateral distances may also be employed. In case the first alignment diagnostic structures 930 are not rounded, the length of each sidewall of the first alignment diagnostic structures 930 may be in a range from 100 nm to 10,000 nm, such as from 300 nm to 3,000 nm, although lesser and greater lateral distances may also be employed. The minimum lateral separation distance between each neighboring pair of the first alignment diagnostic structures 930, which may occur between two corners of a respective neighboring pair of first alignment diagnostic structures 930, may be in a range from 3 nm to 300 nm, such as from 10 nm to 100 nm, although lesser and greater dimensions may also be employed.

In one embodiment, the backside of the first wafer can be thinned such that backside surfaces of the through-substrate via structures 388 are physically exposed. In other words, the first substrate 908 can be thinned from the backside until the backside surfaces of the through-substrate via structures 388 are physically exposed. The thinning of the first wafer may be performed by grinding, polishing, an anisotropic etch process, or an isotropic etch process.

Figure 2A:
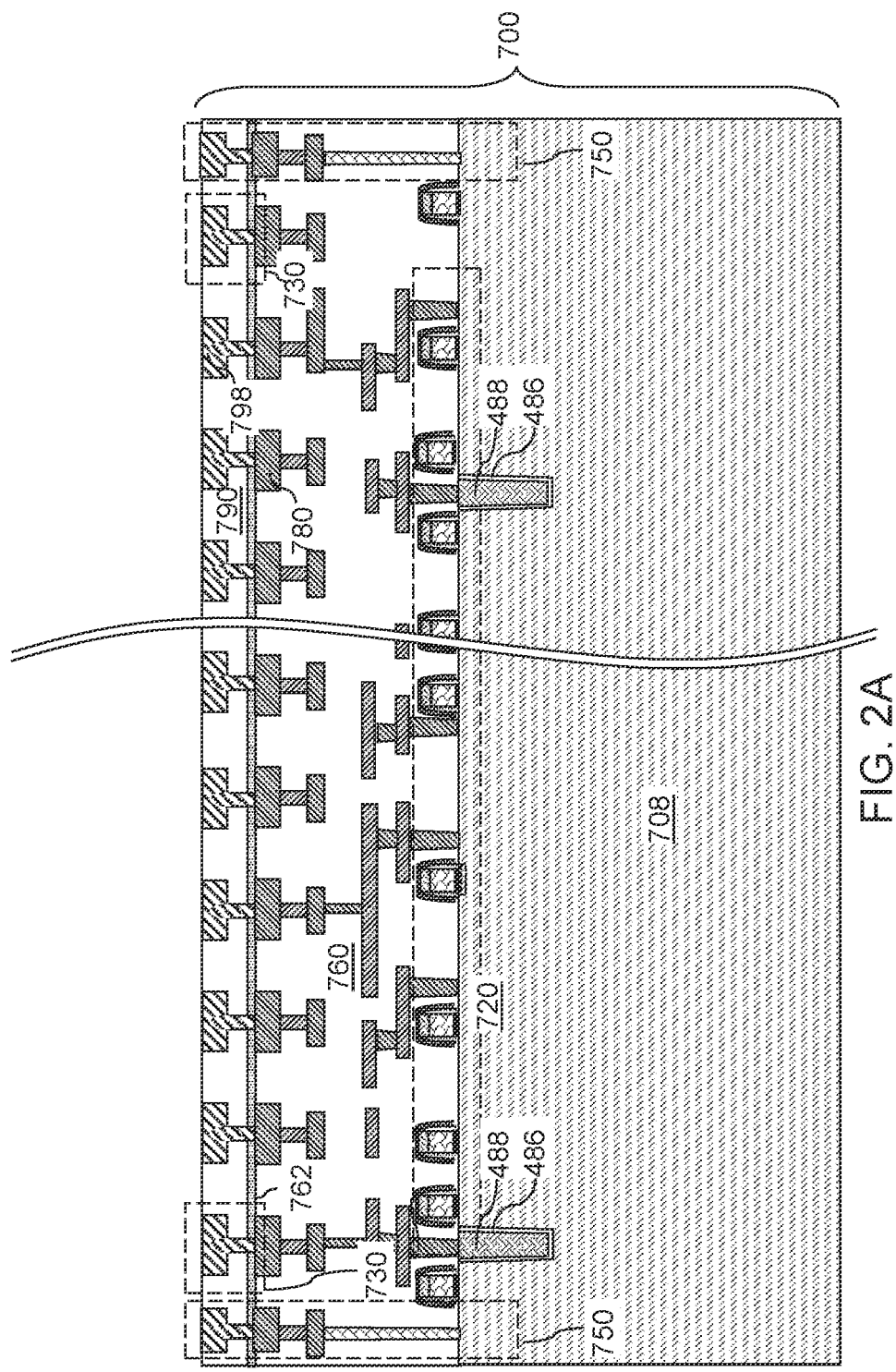
FIG. 2A is a schematic vertical cross-sectional view of a second exemplary semiconductor die according to a second embodiment of the present disclosure.
Figure 2C:
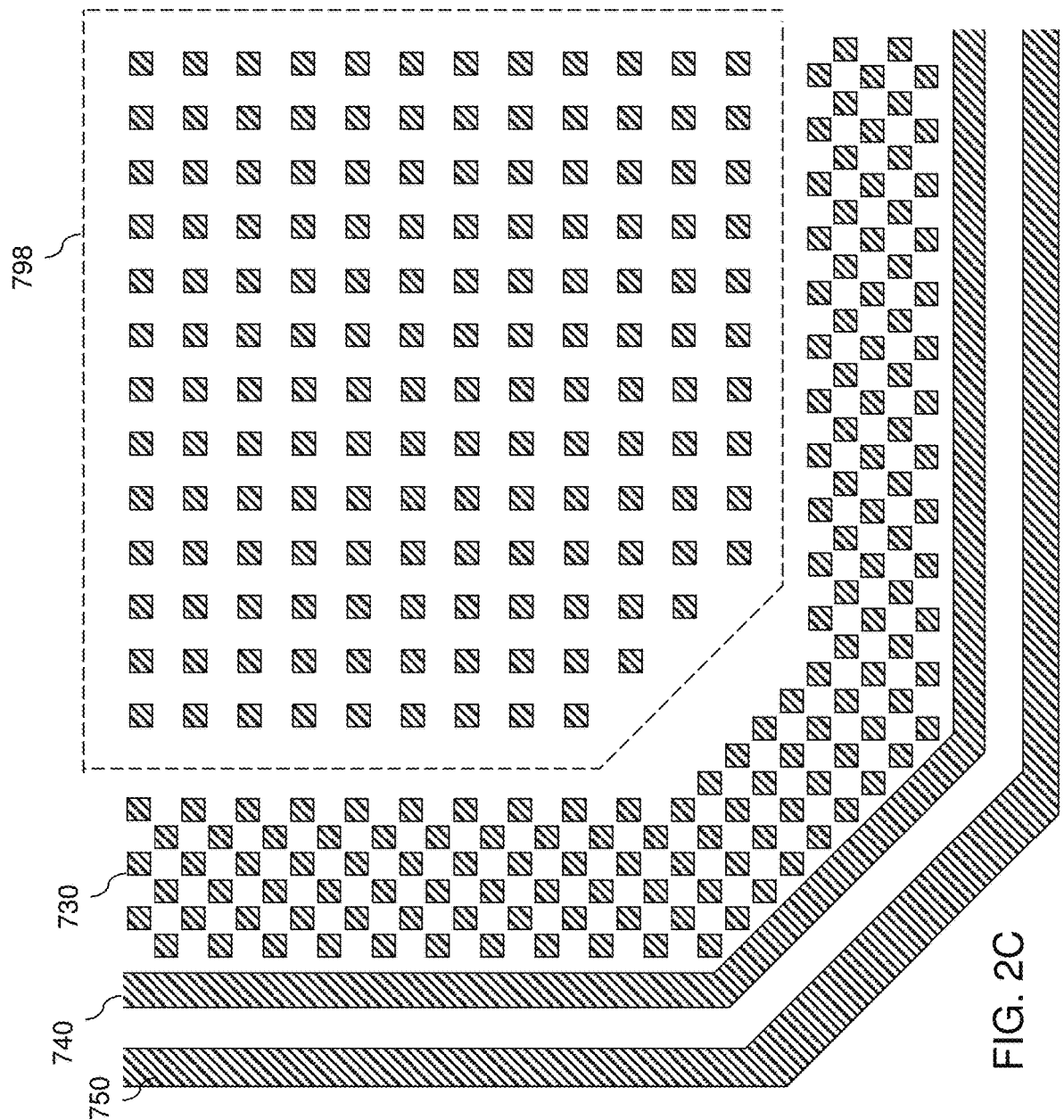
FIG. 2C is a magnified view of a region of the top-down view of FIG. 2B.

Referring to FIGS. 2A-2C, a second semiconductor die 700 according to an embodiment of the present disclosure is illustrated. The second semiconductor die 700 may be provided as one of the second semiconductor dies 700 within a second wafer 708 that includes a two-dimensional array of second semiconductor dies 700. While only a single second semiconductor die 700 is illustrated, it is understood that a second wafer including a two-dimensional array of second semiconductor dies 700 may be manufactured employing standard semiconductor manufacturing processes. The second semiconductor die 700 includes a second substrate 708, second semiconductor devices 720 overlying the second substrate 708, second interconnect-level dielectric material layers 760 overlying the second semiconductor devices 720, and second metal interconnect structures 780 embedded in the second interconnect-level dielectric material layers 760. In one embodiment, the second semiconductor devices 720 may include at least one complementary metal oxide semiconductor (CMOS) circuitry including field effect transistors. In one embodiment, the second substrate 708 may be a second substrate such as a commercially available silicon substrate having a thickness in a range from 500 microns to 1 mm.

Generally, the second semiconductor devices may comprise any semiconductor device that may be operated in conjunction with the first semiconductor devices in the first semiconductor die 900 to provide enhanced functionality. In one embodiment, the first semiconductor die 900 comprises a memory die and the second semiconductor die 700 comprises a logic die that includes a support circuitry (i.e., a peripheral/driver circuitry) for operation of memory devices (such as a three-dimensional array of memory elements) within the memory die. In one embodiment, the first semiconductor die 900 may include a three-dimensional memory device including a three-dimensional array of memory elements, word lines (that may comprise a subset of the electrically conductive layers 46), and bit lines 982, and the second semiconductor devices 720 of the second semiconductor die 700 may include a peripheral circuitry for operation of the three-dimensional array of memory elements. The peripheral circuitry may include one or more word line driver circuits that drive the word lines of the three-dimensional array of memory elements of the first semiconductor die 900, one or more bit line driver circuits that drive the bit lines 982 of the first semiconductor die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor die 900, a source power supply circuit that provides power to the horizontal semiconductor channel layer 10 in the first semiconductor die 900, a data buffer and/or latch, and/or any other semiconductor circuit that may be used to operate three-dimensional memory device of the first semiconductor die 900.

According to an optional aspect of the present disclosure, the second semiconductor die 700 may include a built-in self test (BIST) circuit configured to measure electrical characteristics of pairs of a first alignment diagnostic structure 930 and a second alignment diagnostic structure 730 that is provided in an upper portion of the second semiconductor die 700. Upon subsequent bonding of the first semiconductor die 900 and the second semiconductor die 700, each of the first bonding overly diagnostic structures 930 can be electrically connected to a respective first electrical node of the BIST circuit through a respective first electrically conductive path, and each of the second alignment diagnostic structures 730 can be electrically connected to a respective second electrical node of the BIST circuit through a respective second electrically conductive path. In one embodiment, the BIST circuit is configured to measure a leakage current and/or capacitance across a respective one of the second electrical nodes and a respective one of the first electrical nodes.

Each of the second interconnect-level dielectric material layers 760 may include a dielectric material such as undoped silicate glass, a doped silicate glass, organosilicate glass, silicon nitride, a dielectric metal oxide, or a combination thereof. A second dielectric diffusion barrier layers 762 may be formed over the second interconnect-level dielectric material layers 760. The second dielectric diffusion barrier layer 762 may include silicon carbon nitride (i.e., silicon carbonitride "SiCN", which is also referred to silicon carbide nitride), silicon nitride ($Si_3N_4$), silicon oxynitride, or any other dielectric material that is effective in blocking diffusion of copper. In one embodiment, the second dielectric diffusion barrier layer 762 may include a dielectric material having a dielectric constant less than 5, such as SiCN having a dielectric constant of about 3.8, to reduce RC delay of the second metal interconnect structures 780.

A second bonding-level dielectric layer 790 may be formed over the second dielectric diffusion barrier layer 762. The second bonding-level dielectric layer 790 may include a dielectric material that can provide dielectric-to-dielectric bonding. In one embodiment, the second bonding-level dielectric layer 790 may include undoped silicate glass or a doped silicate glass. The thickness of the second bonding-level dielectric layer 790 may be in a range from 500 nm to 5,000 nm, such as from 1,000 nm to 3,000 nm, although lesser and greater thicknesses may also be employed.

Pad cavities can be formed through the second bonding-level dielectric layer 790, for example, by forming a patterned photoresist layer over the second bonding-level dielectric layer 790 and transferring the pattern in the patterned photoresist layer into the second bonding-level dielectric layer 790 at least once. The pad cavities include bonding pad cavities in which second metallic bonding pads are subsequently employed for metal-to-metal bonding, and overlay diagnostic pad cavities in which second alignment diagnostic structures are subsequently formed. The boding pad cavities may be arranged as a two-dimensional periodic or non-periodic array. The pattern of the overlay diagnostic bonding cavities are subsequently described in detail.

In one embodiment, each of the pad cavities may have a uniform depth. In another embodiment, each of the pad cavities may have an upper pad volume and at least one downward-extending via portions that vertically extends downward from the upper pad volume. A top surface of a respective one of the second metal interconnect structures 780 can be physically exposed at the bottom of each pad cavity. At least one metallic material can be deposited in the pad cavities, and excess portions of the at least one metallic material can be removed from above the horizontal plane including the top surface of the second bonding-level dielectric layer 790 by a planarization process such as a chemical mechanical polishing process. In one embodiment, the at least one metallic material may include a metallic nitride liner material (such as TiN, TaN, or WN) and a metallic fill material (such as Cu) that can provide metal-to-metal bonding. Each remaining portion of the at least one conductive material filling the pad cavities constitute second metal bonding pads 798. A subset of the second metal bonding pads 798 can be electrically connected to a respective electrical node of the second semiconductor devices 720 through a respective subset of the second metal interconnect structures 780. In an embodiment in which through-substrate via structures 488 laterally surrounded by through-substrate dielectric liners 486 are provided within the second substrate 708, another subset of the second metal bonding pads 798 may be electrically connected to a respective one of the through-substrate via structures 488 within the second substrate 708 through a respective subset of the second metal interconnect structures 780. In this case, the through-substrate via structures in the second substrate 708 may be employed to access electrical nodes of the BIST circuit during alignment of wafers including an array of first semiconductor dies 900 and an array of second semiconductor dies 700.

Each remaining portion of the at least one conductive material filling the overlay diagnostic bonding cavities comprises a second alignment diagnostic structure 730. In one embodiment, pairs of the second alignment diagnostic structures 730 may be electrically connected among one another through a respective subset of the second metal interconnect structures 780, and may be electrically isolated from the second semiconductor devices 720. For example, each electrically connected subset of two or more of the second alignment diagnostic structures 730 or each electrically connected subset of two or may be electrically connected among one another through a respective subset of the second metal interconnect structures 780

In one embodiment, the second alignment diagnostic structures 730 can be located around an array of second metal bonding pads 788, as schematically illustrated in FIGS. 2B and 2C. In one embodiment, a second edge seal structure 750 can laterally extend along a periphery of each second semiconductor die 700 to provide a metallic diffusion barrier structure that protects the second semiconductor dies 720 from ingress of moisture and/or impurity atoms. The second edge seal structure 750 can continuously extend from a top surface of the second substrate 708 to the top surface of the second bonding-level dielectric layer 790 without any lateral opening therethrough. In one embodiment, the second alignment diagnostic structures 730 may be formed between the array of second metal bonding pads 788 and the second edge seal structure 750, and may laterally surround the array of second metal bonding pads 788. In one embodiment, the second metal bonding pads 788 may be arranged as a rectangular periodic array having a first periodicity along a first horizontal direction hd1 and having a second periodicity along a second horizontal direction hd2 that is perpendicular to the first horizontal direction hd1. Each of the first periodicity and the second periodicity may be in a range from 500 nm to 100 microns, such as from 1 micron to 50 microns. In one embodiment, one or more optional additional ring-shaped edge seal structures 740 can be nested inside the second edge seal ring structure 750 in the second semiconductor die 700, as shown in FIGS. 2B and 2C.

In one embodiment, the second alignment diagnostic structures 730 may include square metallic pad structures or rectangular metallic pad structures that are arranged in a checkerboard pattern such that corners of the second alignment diagnostic structures 730 do not contact one another. In one embodiment, the checkerboard pattern of the second alignment diagnostic structures 730 may be configured not to overlap with the checkerboard pattern of the first bonding diagnostic overlay structures 930 if the overlay offset during bonding of a first semiconductor die 900 and a second semiconductor die 700 is zero, and has an overlap if the overlay offset during bonding of the first semiconductor die 900 and the second semiconductor die 700 is above a threshold value along the first horizontal direction hd1 or along the second horizontal direction hd2. In one embodiment, corners of the second alignment diagnostic structures 730 may be rounded with a radius of curvature in a range from 5 nm to 300 nm. The lateral distance between parallel pairs of straight sidewalls of each second alignment diagnostic structure 730 may be in a range from 100 nm to 10,000 nm, such as from 300 nm to 3,000 nm, although lesser and greater lateral distances may also be employed. In case the second alignment diagnostic structures 730 are not rounded, the length of each sidewall of the second alignment diagnostic structures 730 may be in a range from 100 nm to 10,000 nm, such as from 300 nm to 3,000 nm, although lesser and greater lateral distances may also be employed. The minimum lateral separation distance between each neighboring pair of the second alignment diagnostic structures 730, which may occur between two corners of a respective neighboring pair of second alignment diagnostic structures 730, may be in a range from 3 nm to 300 nm, such as from 10 nm to 100 nm, although lesser and greater dimensions may also be employed.

In case through-substrate via structures 488 are present within each second semiconductor die 700, the backside of the second wafer can be thinned such that backside surfaces of the through-substrate via structures 488 in the second wafer are physically exposed. In other words, the second substrate 708 can be thinned from the backside until the backside surfaces of the through-substrate via structures 488 are physically exposed. The thinning of the second wafer may be performed by grinding, polishing, an anisotropic etch process, or an isotropic etch process.

Figure 3:
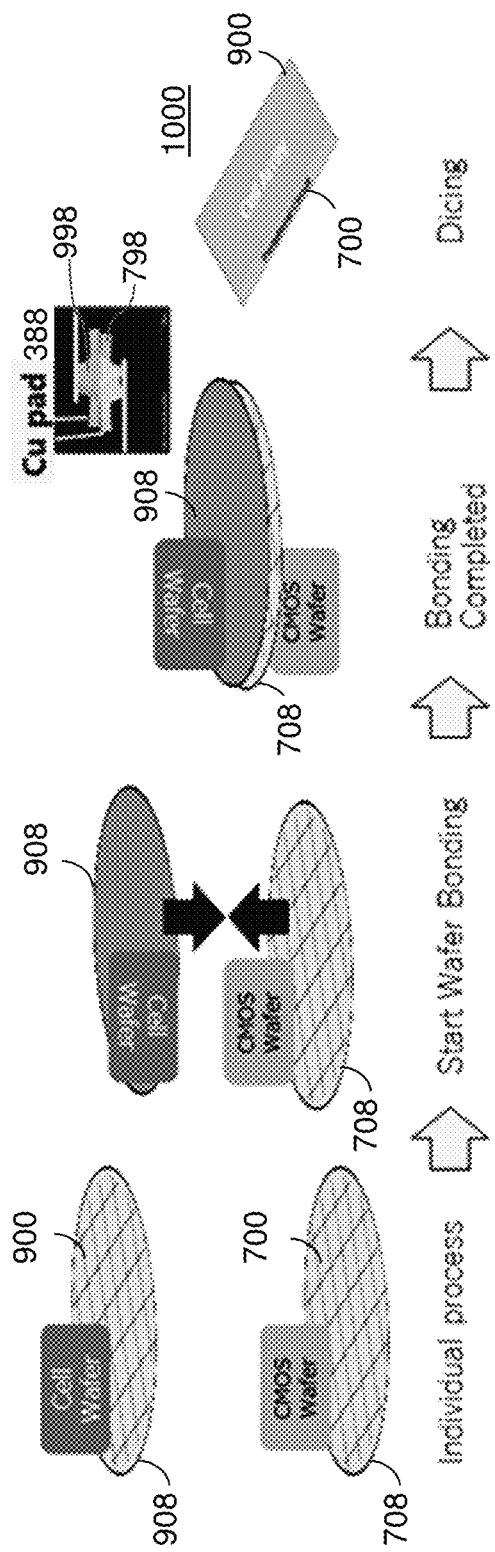
FIG. 3 is a schematic illustration of a sequence of processing steps for forming a bonded assembly and dicing the bonded assembly into semiconductor chips including a respective stack of bonded semiconductor dies according to an embodiment of the present disclosure.

Referring to FIG. 3, a general sequence of processing steps that can be employed to form bonded semiconductor chips 1000 including a respective bonded pair of a first semiconductor die 900 and a second semiconductor die 700 is schematically illustrated. A first wafer 908 including a two-dimensional array of first semiconductor dies 900 (each of which may be the same as the first semiconductor die 900 illustrated in FIGS. 1A-1C) is provided. Generally, each of the first semiconductor dies 900 comprises a respective set of first metal bonding pads 998 and a respective set of first alignment diagnostic structures 930 located at a same level as the first metal bonding pads 998. A second wafer 708 including a two-dimensional array of second semiconductor dies 700 (each of which may be the same as the second semiconductor die 700 illustrated in FIGS. 2A-2C) is provided. Generally, each of the second semiconductor dies 700 comprises a respective set of second metal bonding pads 798 and a respective set of second alignment diagnostic structures 730 located at a same level as the second metal bonding pads 798.

A wafer bonding process can be initiated by aligning the first wafer 908 and the second wafer 708 such that the first metal bonding pads 998 face the second metal bonding pads 798. In one embodiment, the first alignment diagnostic structures 930 are offset from and do not physically contact the second alignment diagnostic structures 730, such that a leakage current and/or a capacitance between adjacent first and second alignment diagnostic structures may be measured. The first wafer and the second wafer may be aligned employing any known alignment methods such as use of infrared beams that penetrate one of the first wafer and the second wafer, are reflected off alignment marks within another of the first wafer and the second wafer, and penetrate the one of the first wafer and the second wafer as a reflected beam. Upon alignment of the first wafer and the second wafer employing conventional methods, the first wafer and the second wafer can be brought into contact with each other.

According to an aspect of the present disclosure, at least one electrical die alignment measurement step is performed. The measurement step may be performed by performing an alignment process in an apparatus configured to test electrical current, which may be a test apparatus including a probe card and contact pins. A leakage current and/or a capacitance (e.g., a capacitive charging current or voltage) is measured between the first alignment diagnostic structures 930 and the second alignment diagnostic structures 730 for multiple adjacent offset pairs of the first semiconductor dies 900 and the second semiconductor dies 700. In one embodiment, the first alignment diagnostic structures 930 and the second alignment diagnostic structures 730 can have patterns such that when the overlay offset between each mating pair of a first semiconductor die 900 and the second semiconductor die 700 is within a preset overlay offset threshold, and the leakage current and/or capacitance is within a preset current limit.

The leakage current and/or capacitance may be measured by applying external test voltages or currents through the test apparatus, or by activating a BIST circuit within each second semiconductor die 700 employing the test apparatus. If the overlay offset between any mating pair of a first semiconductor die 900 and the second semiconductor die 700 exceeds the preset overlay threshold, then the leakage current and/or capacitance exceeds the preset leakage current and/or capacitance limit. If the total number of tested pairs of semiconductor dies (900, 700) (which may, or may not, equal to total number of bonding pairs of the semiconductor dies (900, 700)) having a respective leakage current and/or capacitance that is greater than the preset leakage current and/or capacitance limit exceeds a predefined number (which may, or may not, be zero), then the first wafer and/or the second wafer can be moved linearly and/or azimuthally to perform another leakage current and/or capacitance measurement step. The relative movement of the first wafer and/or the second wafer and a subsequent leakage current and/or capacitance measurement step may be repeated as many times as needed until the total number of tested pairs of semiconductor dies (900, 700) having a respective leakage current and/or capacitance that is greater than the preset capacitance limit is less than the predefined number, or until a preset maximum number of relative movements between the first wafer and the second wafer that the test program allows.

Upon determination of an optimal position between the first wafer and the second wafer that provides the maximal number of mating pairs of semiconductor dies (900, 700), the relative position between the first wafer and the second wafer may be locked, for example, by applying sufficient backside pressure that prevents lateral slippage between the first wafer and the second wafer, and the assembly of the first wafer and the second wafer may be transferred to a bonding station. Generally, the second wafer and the first wafer can be bonded after performing the at least one capacitance measurement step employing the electrical data generated from the at least one capacitance measurement step.

In one embodiment, each leakage current and/or capacitance measurement step may be performed by positioning the wafer stack of the first wafer and the second wafer on a tester (i.e., a test apparatus) configured to provide test pulses to metallic contact structures (such as through-substrate via structures 388 which may be a copper pad) within one of the first wafer and the second wafer, and by applying test signals to the metallic contact structures.

Figure 4:
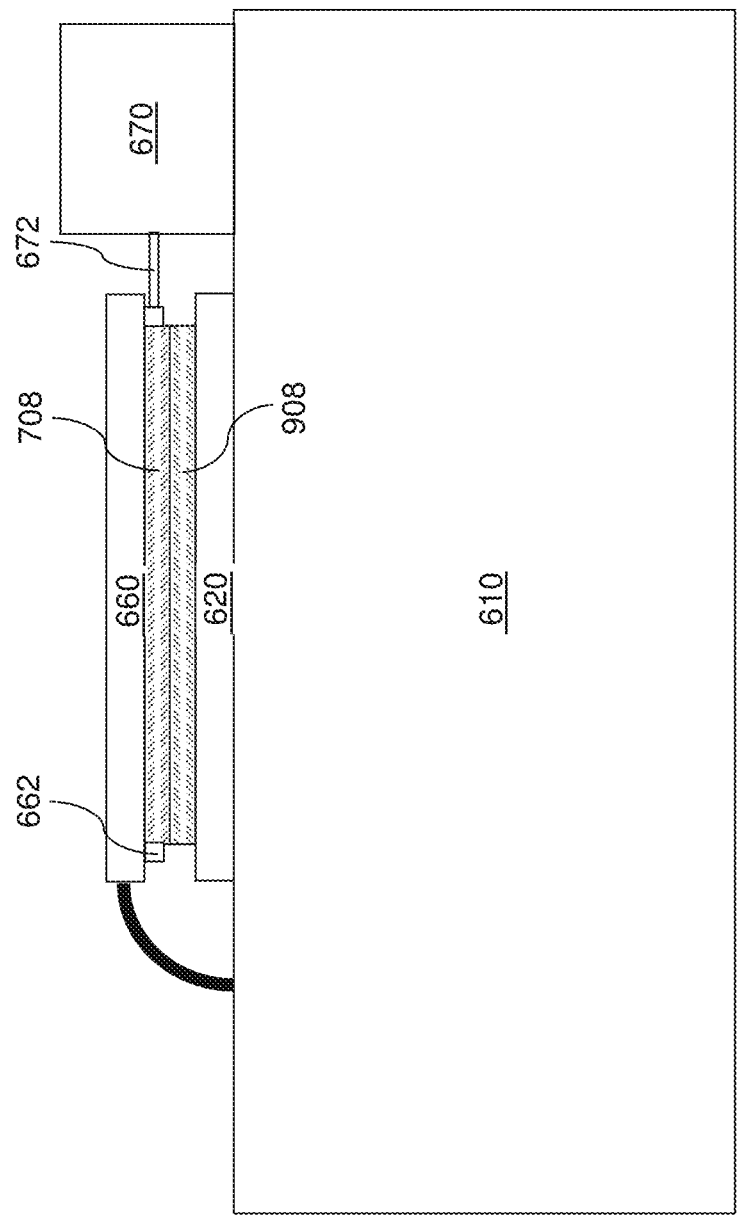
FIG. 4 illustrates an exemplary test apparatus that can be employed to implement the methods of the present disclosure.

Referring to FIG. 4, an exemplary test apparatus (i.e., a tester) that can be employed to implement the methods of the present disclosure is illustrated. The test apparatus can be configured to test functionality of a stack of a first wafer 908 and a second wafer 708 in an unbonded state, i.e., prior to wafer bonding between the first wafer and the second wafer. Alternatively, the first and the second wafers can be bonded to each other prior to the testing. The test apparatus comprises a wafer chuck 620 configured to hold the first wafer 908 in a first position during testing, a wafer retainer ring 672 configured to laterally confine the second wafer 708 and to press a periphery of the second wafer 708 toward the first wafer 908 during testing; and a tester head 660 overlying the wafer chuck 620 and the wafer retainer ring 662 and comprising a probe card (not expressly shown) including an array of contact pins (not expressly shown) configured to contact conductive structures (e.g., copper pads, such as the through-substrate via structures 388 or the through-substrate via structures 488) located on a backside of the second wafer 708.

The test apparatus may include a tester frame 610 providing physical support and electrical connection to the wafer chuck 620 and to the tester head 660. Further, the test apparatus may include at least one actuator configured to move the wafer chuck 620 and the tester head 660. For example, a test head actuator 670 and a mechanical arm 672 may be provided to enable movement of the wafer retainer ring 672. A chuck actuator (not expressly illustrated) may be provided within the tester frame 610 underneath the wafer chuck 620.

In one embodiment, the test apparatus may comprise an automated program that is configured to generate leakage current and/or capacitance measurement data for mating pairs of a first semiconductor die (which can be, for example, a first semiconductor die 900 described above) in the first wafer 908 and a second semiconductor die (which can be, for example, the second semiconductor die 700 described above) in the second wafer 708 by executing at least one program step that is selected from: a direct leakage current and/or capacitance measurement step in which different voltages are applied to a pair of contact pins among the contact pins and electrical current between the pair of contact pins is measured by the test apparatus, and a built-in-self-test capacitance measurement step in which a test initiation signal is transmitted to a built-in-self-test (BIST) circuit within the second wafer 708 and the test apparatus enters into a data reception mode that receives data representing leakage current and/or capacitance as measured by the BIST circuit through a subset of the contact pins. In other words, the leakage testing may be performed ex-situ by the test apparatus, or may be performed in-situ by activating the BIST circuits within the second semiconductor dies 700.

In one embodiment, the test apparatus is configured to provide a relative movement between the first semiconductor die 900 and the second semiconductor die 700 (and correspondingly, between the first wafer 908 and the second wafer 708) by moving at least one of the wafer chuck 620 and the wafer retainer ring 662.

In one embodiment, the relative movement comprises changing lateral overlay (i.e., translation) or a relative azimuthal angle (i.e., rotation) between the second wafer 708 and the first wafer 908. Generally, relative movements between a pair of wafers can be employed in testing a wafer stack according to an embodiment of the present disclosure.

In one embodiment, the test apparatus is configured to provide the relative movement in-situ (i.e., while the wafers are located on the test apparatus) by separating the second wafer from the first wafer, by repositioning at least one of the first wafer 908 and the second wafer 708, and by positioning the second wafer 708 directly on the first wafer 908.

According to an aspect of the present disclosure, lateral overlay or a relative azimuthal angle can be changed at least once between the second wafer 708 and the first wafer 908 after an initial leakage current and/or capacitance measurement step; and at least one additional leakage current and/or capacitance measurement step can be performed after at least one change in the lateral overlay or the relative azimuthal angle after performing the initial capacitance measurement step.

In one embodiment, the at least one change in the lateral overlay or the relative azimuthal angle is made in-situ on the test apparatus by separating the second wafer from the first wafer, by repositioning at least one of the first wafer 908 and the second wafer 708, and by restacking the first wafer 908 and the second wafer 708. The at least one additional capacitance measurement step (which may be a plurality of additional capacitance measurement steps) can be performed while the first wafer 908 and the second wafer 708, as restacked, are located on the test apparatus, i.e., on the wafer chuck 620 and the wafer retainer ring 672.

In one embodiment, the bonding yield can be measured for each setting of the lateral overlay and the relative azimuthal angle between the first wafer 908 and the second wafer 708. The bonding yield refers to the percentage of mating pairs of a first semiconductor die 900 and a second semiconductor die 700 that provides a less than a preset threshold value for a leakage current and/or capacitance relative to all tested mating pairs within the first wafer 908 and the second wafer 708. In one embodiment, an optimal setting of lateral overlay and the relative azimuthal angle that provides a maximum of the bonding yield among the settings of the lateral overlay and the relative azimuthal angle can be determined by the test apparatus. Subsequently, the first wafer 908 and the second wafer 708 are bonded at the optimal setting.

In one embodiment, the test apparatus may be configured to test multiple potential bonding positions between the first wafer 908 and the second wafer 708, and to determine an optimal bonding position for the first wafer 908 and the second wafer 708. In one embodiment, the test apparatus is configured to determine a bonding yield from the for a leakage current and/or capacitance measurement data for each setting of a lateral overlay and a relative azimuthal angle between the first wafer 908 and the second wafer 708 as generated by the relative movement between the first wafer 908 and the second wafer 708; and to determine an optimal setting for the lateral overlay and the relative azimuthal angle that provides a maximum of the bonding yield among the settings of the lateral overlay and the relative azimuthal angle. Alternatively, bonded wafers (e.g., a chip 1000) may be tested as a pass/fail type test, and failed bonded wafers may be discarded.

In one embodiment, the second wafer 708 comprises through-substrate via structures (388 or 488) that vertically extend through the second wafer 708, and the metallic contact structures contacted by the test pins of the probe comprise a respective subset of the through-substrate via structures (e.g., contact pads 388 or 488) or a subset of external contact pads (not illustrated) that can be located on a backside surface of the second wafer 708 and contacting the through-substrate via structures (388 or 488).

Measurement of the leakage current and/or capacitance across each contacting pair of a first semiconductor die 900 and a second semiconductor die 700 can be performed by electrically biasing the first alignment diagnostic structures 930 and the second alignment diagnostic structures 730. In one embodiment, the test apparatus applies a first signal to the first alignment diagnostic structures 930 through first metal interconnect structures 980. In one embodiment, the test apparatus applies a second test signal to the second alignment diagnostic structures 730 through a subset of the second metal interconnect structures 780 without passing the second test signal passing through the first semiconductor dies.

Referring to FIGS. 5A-5G, the first alignment diagnostic structures 930 and the second alignment diagnostic structures 730 can be configured in a suitable geometry that generates, and/or increases, a leakage current and/or capacitance between the first alignment diagnostic structures 930 and the second alignment diagnostic structures 730 upon misalignment of a corresponding (e.g., nearest neighbor) pair of a first semiconductor die 900 and a second semiconductor die 700.

In one embodiment, the first alignment diagnostic structures 930 can comprise a first array of metallic pad structures, and the second alignment diagnostic structures 730 can comprise a second array of metallic pad structures that are configured to be interlaced with the first alignment diagnostic structures 930 and configured not to directly contact the first alignment diagnostic structures 930 when an overlay offset between the first wafer 908 and the second wafer 708 is zero. In case the overlay offset between the first wafer 908 and the second wafer 708 increases above a preset threshold value (i.e., a preset overlay tolerance), the leakage current and/or capacitance between at least one set of first alignment diagnostic structures 930 and second alignment diagnostic structures 730 increases above a preset threshold value.

Figure 5A:
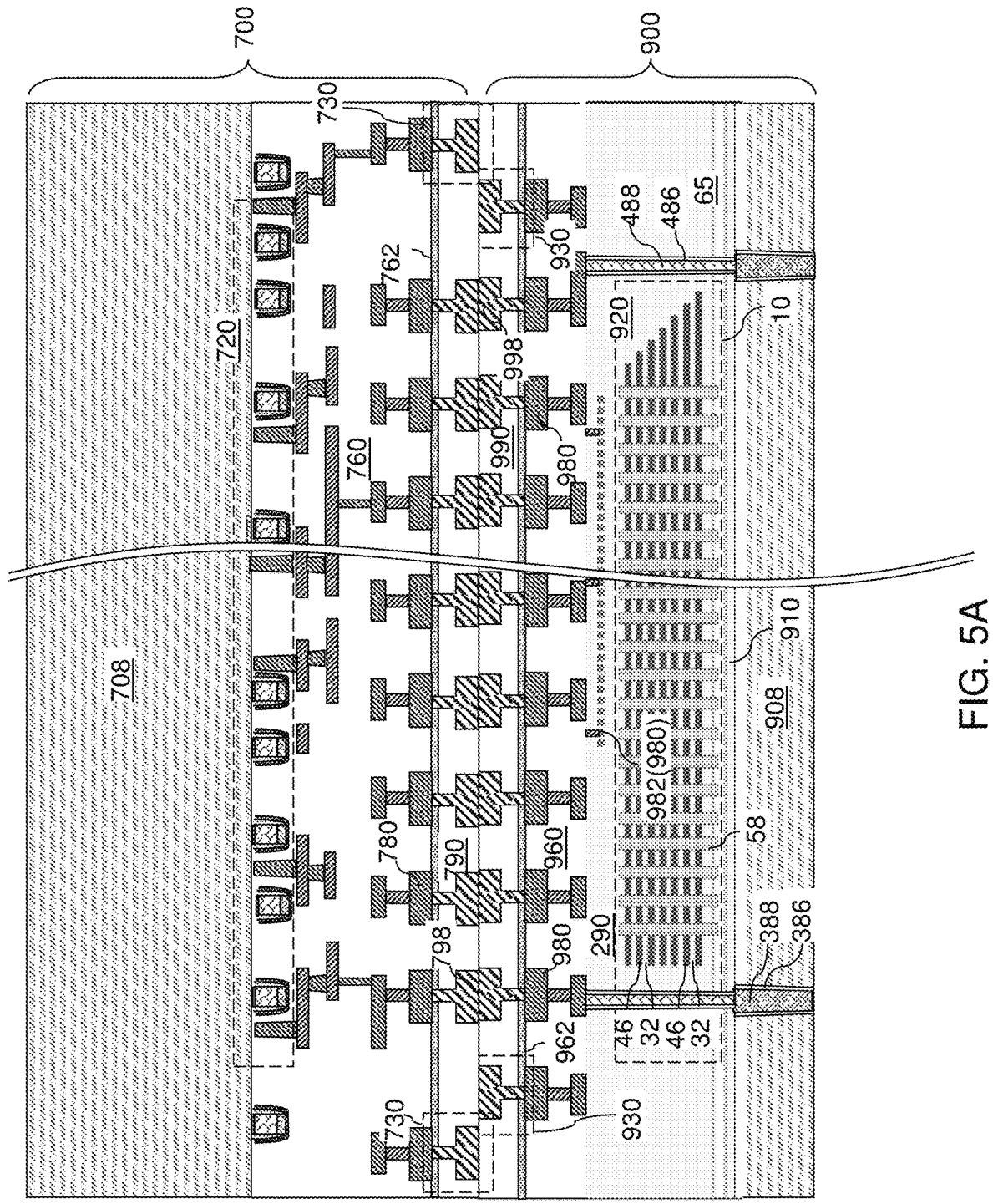
FIG. 5A is a vertical cross-sectional view of a first exemplary structure including a bonded assembly of the first semiconductor die and the second semiconductor die according to an embodiment of the present disclosure.
Figure 5B:
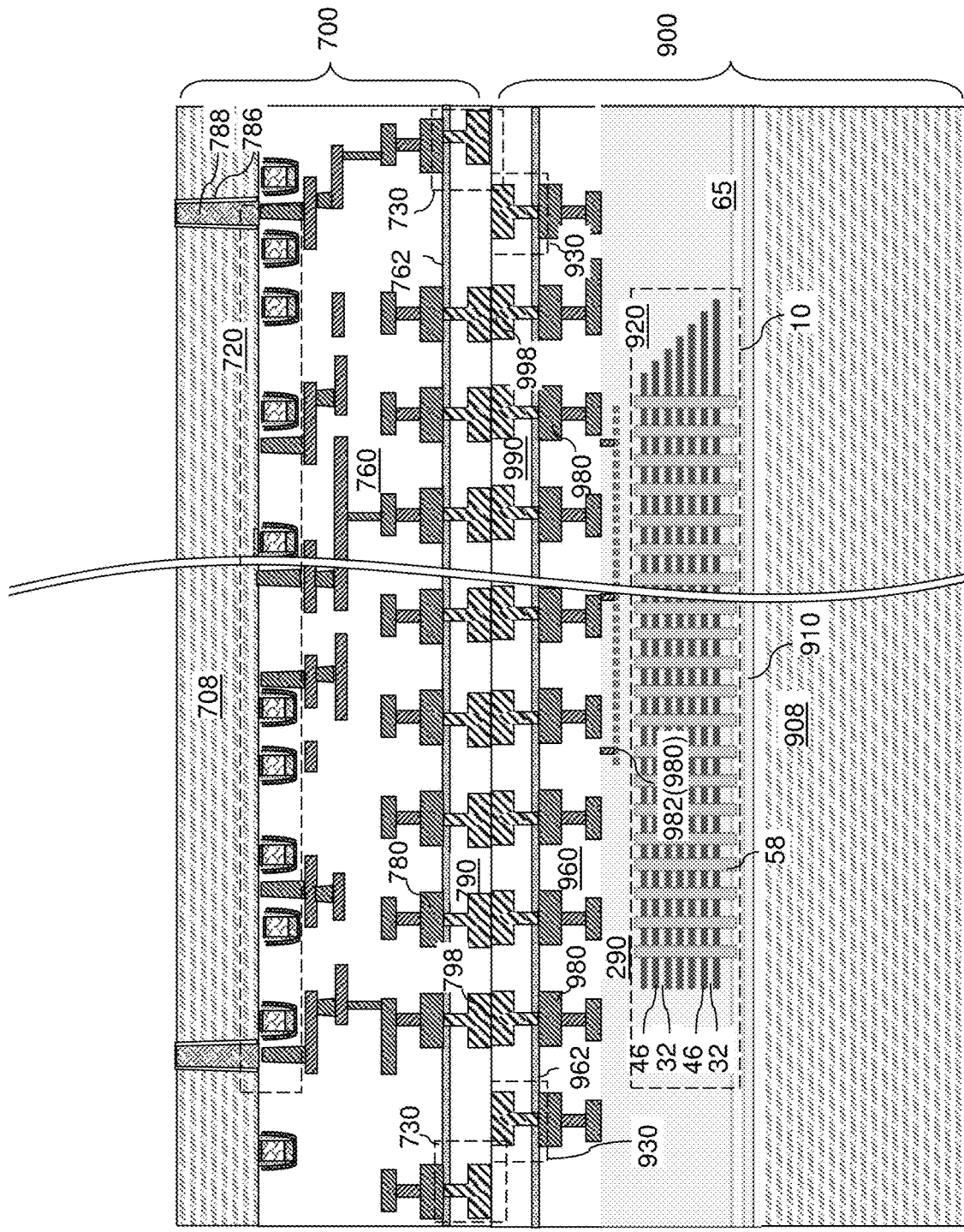
FIG. 5B is a vertical cross-sectional view of a second exemplary structure including a bonded assembly of alternative embodiments of the first semiconductor die and the second semiconductor die according to an embodiment of the present disclosure.
Figure 5D:
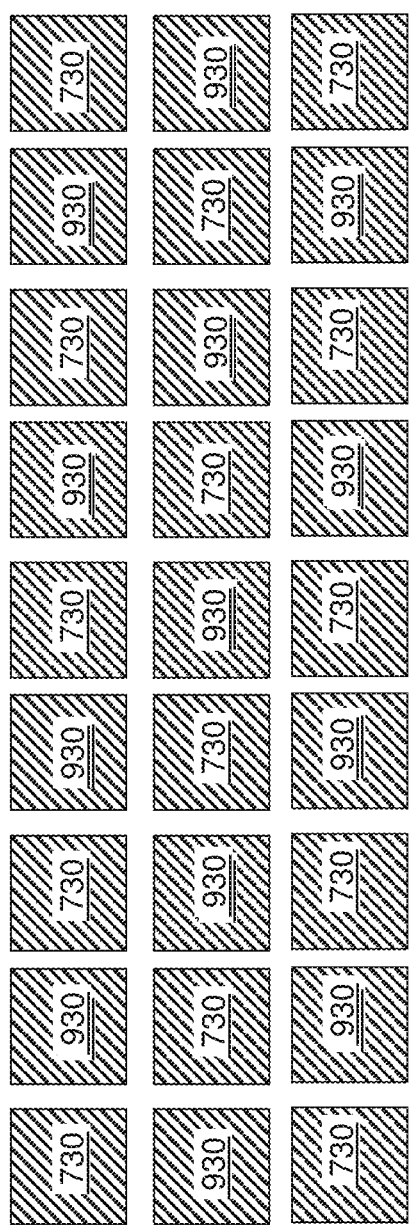
FIG. 5D is a magnified view a region of the plan view of FIG. 5C.
Figure 5E:
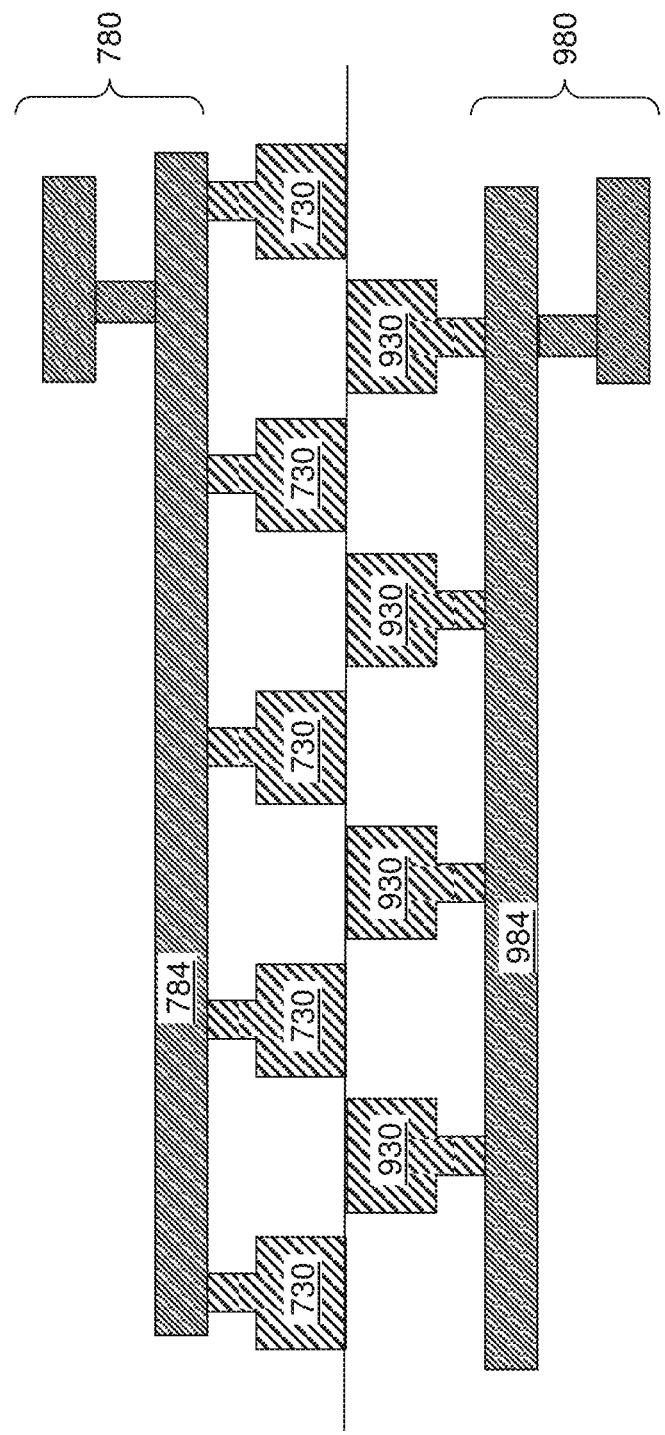
FIG. 5E is a schematic vertical cross-sectional view of a portion of a bonded assembly of FIG. 5A or FIG. 5B according to an embodiment of the present disclosure.
Figure 5F:
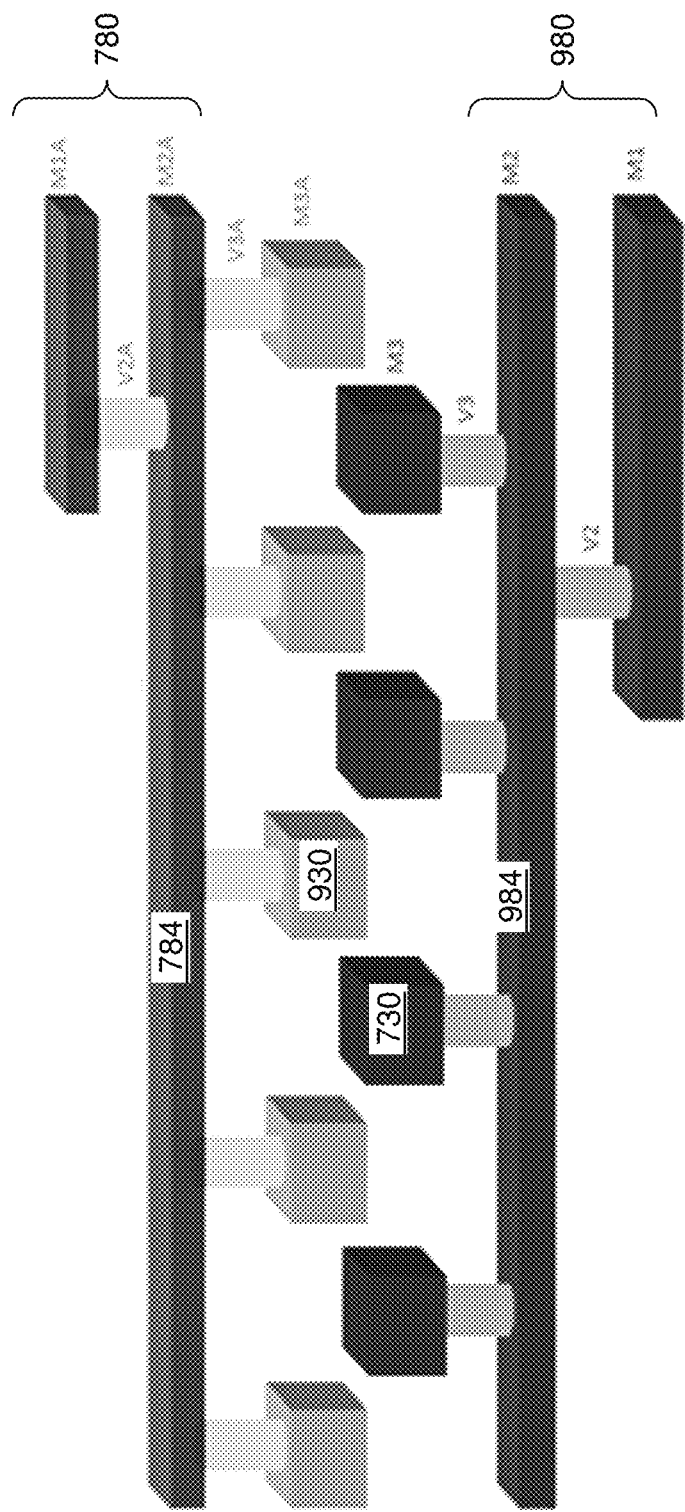
FIG. 5F is a perspective view of the structure illustrated in FIG. 5E.

In one embodiment shown in FIGS. 5E and 5F, the first alignment diagnostic structures 930 and the second alignment diagnostic structures 730 comprise an array of metallic pad structures located over one of the first wafer 908 and the second wafer 708, and the respective interconnect structures 980 and 780 include a metallic ring structure (984 or 784) that is nested inside an edge seal ring (950 or 750), is located below the respective structures (930 or 730), and electrically interconnects the respective array of metallic pad structures (930 or 730). The metallic ring structures (984 or 784) are located in the respective first metal level (M2A or M2 in FIG. 5F) of the interconnect structures 980 and 780 while the respective first and second alignment diagnostic structures (930, 730) are located in the respective third metal level (M3A or M3). The metallic ring structures (984 or 784) are electrically connected to a first metal level (M1A or M1) by respective via structures (V3A and V3) and to the first metal level by additional via structures (V2A and V2).

During the alignment measurement, one set of alignment diagnostic structures selected from the set of the first alignment diagnostic structures 930 and the set of the second alignment diagnostic structure 730 is connected to a first node of a power supply circuit, and provided in the test apparatus or as activated within the BIT circuit, and another set of alignment diagnostic structures selected from the set of the first alignment diagnostic structures 930 and the set of the second alignment diagnostic structure 730 is connected to a second node of a power supply circuit, which may be a ground node. The set of the first alignment diagnostic structures 930 and the set of the second alignment diagnostic structure 730 collectively function as offset electrodes separated by a dielectric or as a capacitor. The pattern of the first alignment diagnostic structures 930 and the pattern of the second alignment diagnostic structure 730 are selected such that the leakage current and/or capacitance increases or decreases with an increase in the overlay offset between a mating pair of a first semiconductor die 900 and a second semiconductor die 700. The test apparatus or the BIST circuit can measure the total current that flows between the first node and the second node of the power supply circuit when the power supply circuit biases the combination of the first alignment diagnostic structures 930 and the second alignment diagnostic structure 730 to a predetermined charging voltage.

In one embodiment, the first alignment diagnostic structures 930 and the second alignment diagnostic structure 730 may be configured to measure the overlay offset in multiple directions. For example, the multiple directions may include a direction that is parallel the first horizontal direction hd1, a direction that is antiparallel to the first horizontal direction hd1, a direction that is parallel to the second horizontal direction hd2, and a direction that is antiparallel to the second horizontal direction hd2.

According to an aspect of the present disclosure, the overlay offset can be measured with directionality for each tested pair of a first semiconductor die 900 and a second semiconductor die 700. In one embodiment, the overlay offset can be measured with directionality for all mating pairs of a first semiconductor die 900 and a second semiconductor die 700 of the first wafer 908 and the second wafer 708. Thus, any effect of wafer warpage and/or misalignment upon the bonding yield can be predicted prior to the bonding process, and the lateral offset between the first wafer 908 and the second wafer 708 can be selected in a manner that maximizes the bonding yield. Thus, mating pairs of a first semiconductor die 900 and a second semiconductor die 700 that cannot be bonded to form a functional semiconductor chip during the process of optimizing the bonding yield may be ignored during subsequent processing, and can be ultimately discarded.

FIG. 5G illustrates exemplary parameters that can be employed to optimize the pattern of the first and second alignment diagnostic structures (930, 730). Parameters that may be employed to optimize the capacitive structure formed by a set of first alignment diagnostic structures 930 and a set of second alignment diagnostic structures 730 include a lateral gap distance "a" between a neighboring pair of a first alignment diagnostic structure 930 and a second alignment diagnostic structure 730 (in a plan view), a vertical offset distance "b" between edges of a first alignment diagnostic structure 930 and a second alignment diagnostic structure 730 along a direction that is perpendicular to the direction of the lateral gap distance "a", first diagnostic pad dimension "c" that is a length of a bottom or top surface of a first alignment diagnostic structure 930, and a second diagnostic pad dimension "d" that is a length of a bottom or top surface of a second alignment diagnostic structure 730. Various other dimensions may be employed to optimize the design for the first alignment diagnostic structures 930 and the second alignment diagnostic structures 730.

In one embodiment, each of the second semiconductor dies 700 may comprise a built-in-self-test (BIST) circuit configured to measure the leakage current and/or capacitance between the second alignment diagnostic structures 730 therein and first alignment diagnostic structures 930 within a respective mating pair of a first semiconductor die and a second semiconductor die. In this case, performing the leakage current and/or capacitance measurement step comprises initiating operation of the BIST circuit employing the test apparatus.

Figure 6:
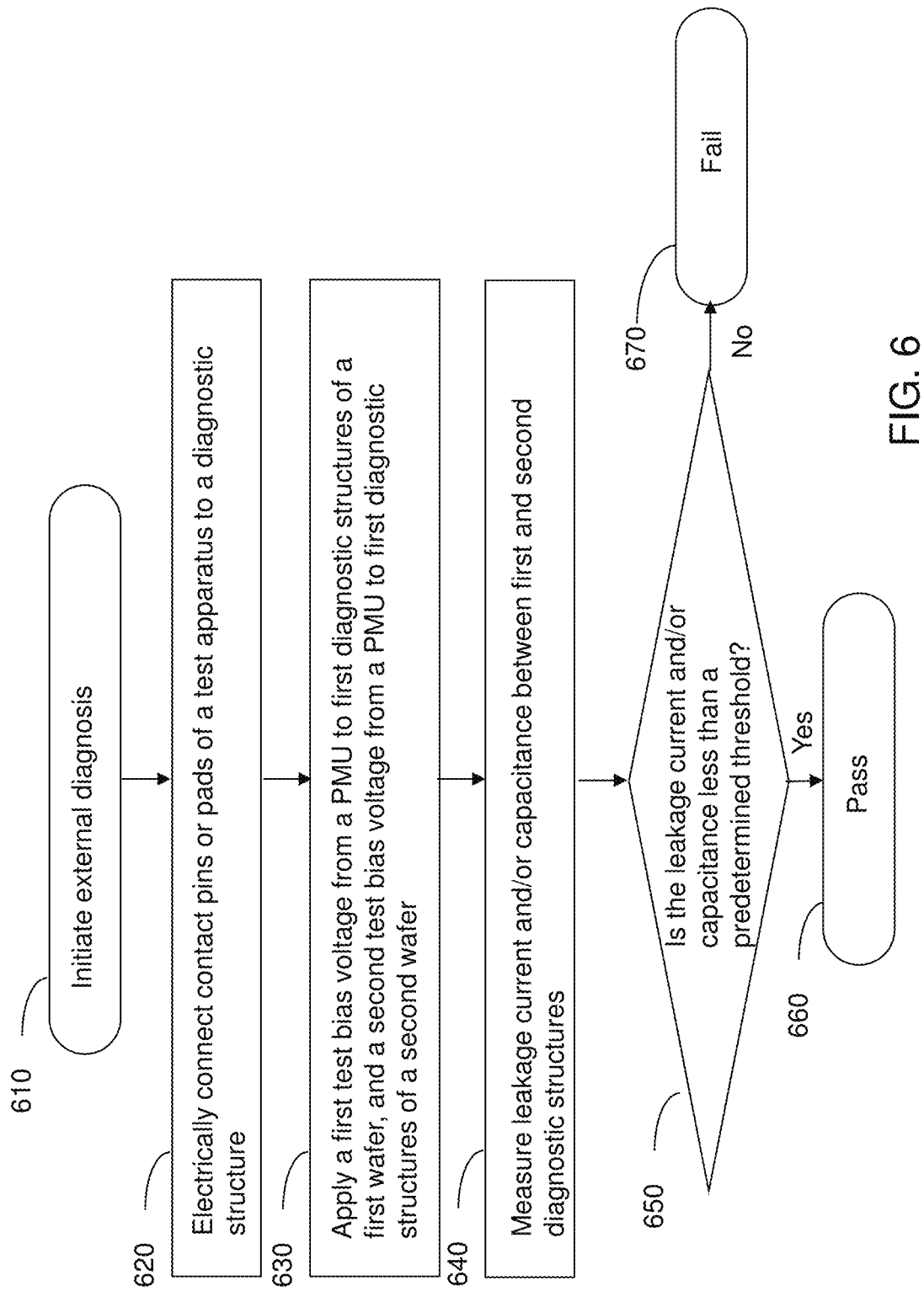
FIG. 6 is a first flow chart illustrating a first exemplary method for determining a capacitance level between a pair of aligned semiconductor dies prior to wafer bonding according to an embodiment of the present disclosure.

Referring to FIG. 6, a first flow chart illustrates a first exemplary method for determining a capacitance level between a pair of aligned semiconductor dies (900, 700) prior and/or after to wafer bonding according to an embodiment of the present disclosure. In this embodiment, an external diagnostic mode is employed.

Referring to step 610, an external diagnosis of the alignment between the first wafer 908 and the second wafer 708 is initiated.

Referring to step 620, contact pins or pads of a test apparatus can be electrically connected to the first alignment diagnostic structures 930 and the second alignment diagnostic structures 730. For example, the contact pins or pads in a probe card in the test apparatus are connected to the metallic contact structures (which may be through-substrate via structures (388 or 488)).

Referring to step 630, a first test bias voltage from a first pulse modulation unit (PUM) in the probe card is applied to the first alignment diagnostic structures 930, and a second test bias voltage from a second PUM in the probe card is applied to the second alignment diagnostic structures 730. The second test bias voltage may comprise $V_{ss}$ (e.g., ground). Multiple pairs of PUM's may be employed to simultaneously make measurement on multiple capacitive structures including a respective set of first alignment diagnostic structures 930 and second alignment diagnostic structures 730 that are configured to measure overlay offsets in different directions.

Referring to step 640, the leakage current that flows between the two PUM's or the capacitance between them can be measured to determine the leakage current and/or capacitance of the assembly of the first alignment diagnostic structures 930 and the second alignment diagnostic structures 730.

Referring to step 650, the measured net leakage current and/or capacitance (i.e., the measured leakage current and/or capacitance less background leakage current and/or capacitance measured without the test bias voltage) is compared with a predetermined threshold value to determine if the net leakage current and/or capacitance is within the predetermined specification. If all net leakage current and/or capacitance measurements are within the specification, the process flow proceeds to step 660, and the measured pair of a first semiconductor die 900 and a second semiconductor die 700 passes the measurement test. If a net leakage current and/or capacitance measurements are outside the specification, the process flow proceeds to step 670, and the measured pair of a first semiconductor die 900 and a second semiconductor die 700 fails the current measurement test.

Generally, the leakage current and/or capacitance measurement step may comprise the steps for applying a first voltage to the first alignment diagnostic structures 930 within a selected adjacent pair of a first semiconductor die 900 and a second semiconductor die 700 of the first semiconductor dies 900 and the second semiconductor dies 700 employing the test apparatus, applying a second voltage to the second bonding overly diagnostics structures 730 within the selected adjacent pair employing the test apparatus employing the test apparatus, and measuring the leakage current and/or capacitance between the first alignment diagnostic structures 930 and the second alignment diagnostic structures 730 of the selected adjacent pair while applying the first voltage and the second voltage (which may be zero volts or ground).

In an alternative embodiment, an internal diagnostic mode may be employed in lieu of an external diagnostic mode. In the internal diagnostic mode, a BIST circuit can be provided within the second semiconductor devices 720.

Figure 7:
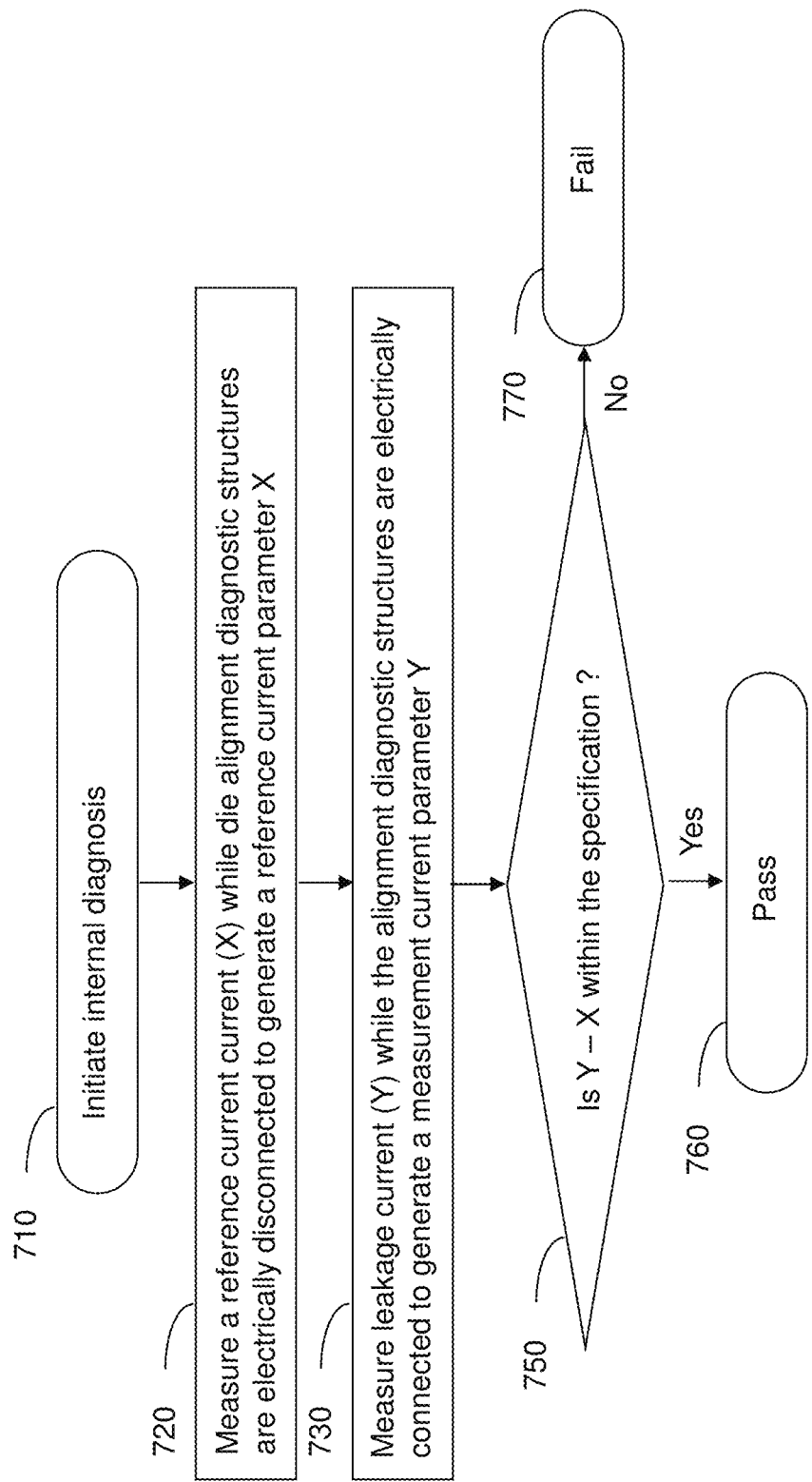
FIG. 7 is a second flow chart illustrating a second exemplary method for determining a capacitance level between a pair of aligned semiconductor dies prior to wafer bonding according to an embodiment of the present disclosure.
Figure 8:
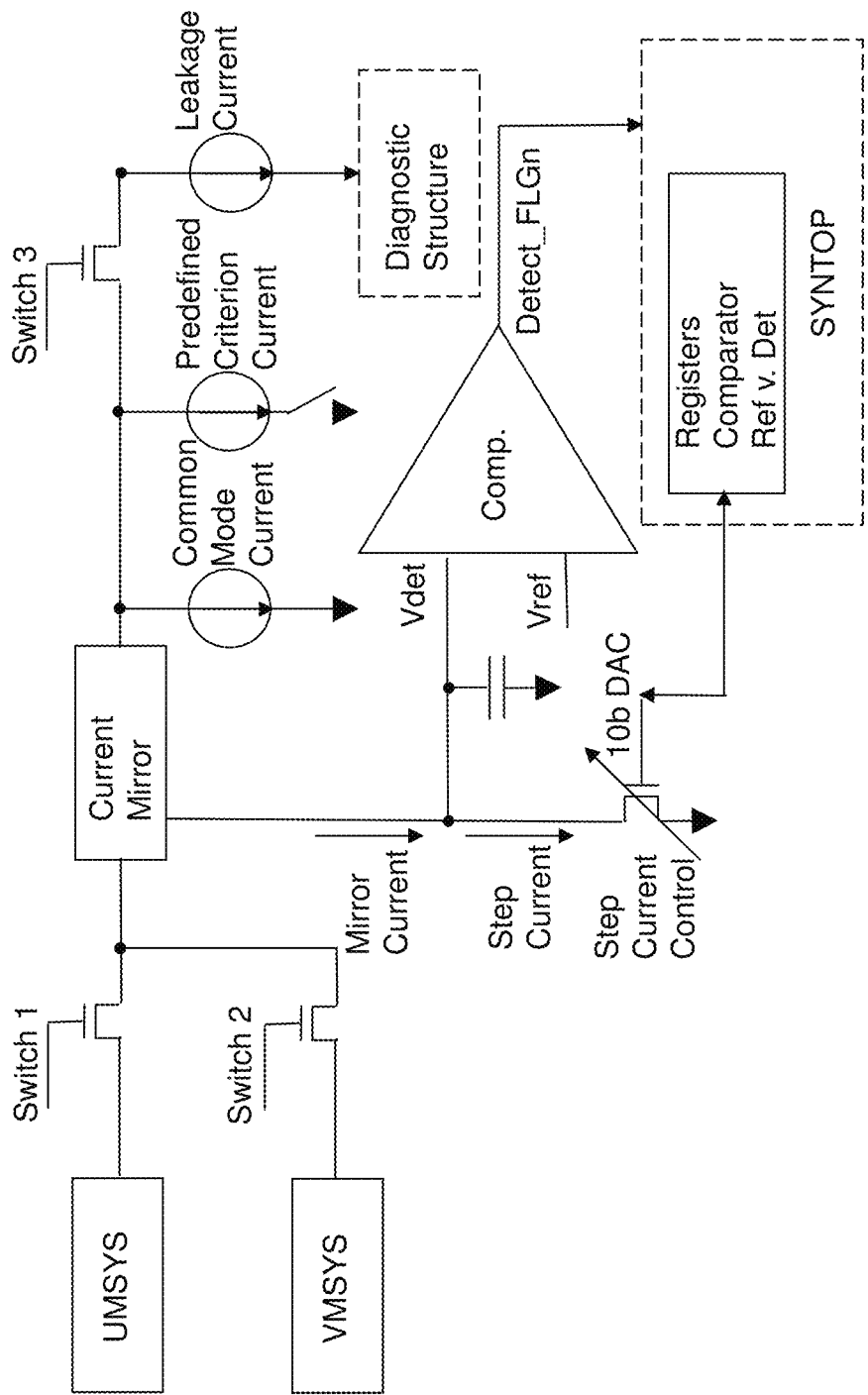
FIG. 8 is an exemplary test circuit that may be employed in conjunction with the processing steps of FIG. 7.

FIG. 7 is a second flow chart illustrating a second exemplary method for determining a leakage current between a pair of aligned semiconductor dies employing a current mirror circuit as a measurement circuit in the BIST circuit prior to or after wafer bonding according to an embodiment of the present disclosure. FIG. 8 is an exemplary test circuit that may be employed in conjunction with the processing steps of FIG. 7.

Referring collectively to FIGS. 7 and 8, the BIST circuit comprises a current mirror circuit configured to measure a reference leakage current and a total leakage current between the second alignment diagnostic structures 730 and the first alignment diagnostic structures 930 within the respective mating pair of a first semiconductor die 900 and a second semiconductor die 700. The second alignment diagnostic structures 730 and the first alignment diagnostic structures 930 are electrically disconnected from the BIST circuit during measurement of the reference leakage current, and are electrically connected to the BIST circuit during measurement of the total leakage current. The leakage current from the diagnostic structures is translated to pump clock count. Pump clock is counted in measurement circuit SYNTOP and stored for comparison, as shown in FIG. 8. There are also three phases similar to a current mirror mode.

Referring to step 710 of FIG. 7, an internal diagnosis of the alignment between the first wafer 908 and the second wafer 708 is initiated. In this case, the test apparatus can issue a BIST test initiation commend to the BIST circuit within the second semiconductor die 700 of the mating pair of a first semiconductor die 900 and a second semiconductor die 700.

Referring to step 720 of FIG. 7, a reference current can be measured while the first and second alignment diagnostic structures (930, 730) are electrically disconnected, and a reference leakage current is enabled within the BIST circuit. A reference current parameter X (which may be represented as an equivalent digital code) is recorded (which is referred to as "X") in corresponding measurement circuit in SYNTOP illustrated in FIG. 8. The total reference current includes a pre-defined criterion current, a common mode current from the current mirror, a step current, and a junction leakage current from corresponding measurement circuits.

Referring to step 730 of FIG. 7, the first and second alignment diagnostic structures (930, 730) are electrically connected to the BIST circuit. The pre-defined criterion current is disabled. A leakage current between the first and second alignment diagnostic structures (930, 730) flows through the leakage current detection circuit. The total leakage detection current includes the leakage current between the first and second alignment diagnostic structures (930, 730), the common mode current from the current mirror, the step current, and the junction leakage current from corresponding measurement circuits. A measurement current parameter Y (which may be represented as an equivalent digital code) representing the measured total leakage current is recorded.

Referring to step 750 of FIG. 7, the difference between the measurement current parameter Y and the reference current parameter X is calculated. If the difference is within the specification, the process flow proceeds to step 760, and the measured pair of a first semiconductor die 900 and a second semiconductor die 700 passes the measurement test. If the difference is outside the specification, the process flow proceeds to step 770, and the measured pair of a first semiconductor die 900 and a second semiconductor die 700 fails the measurement test.

In summary, in the method of FIG. 7, the BIST circuit comprises a current mirror circuit which measures a reference leakage current while electrically disconnected from the first alignment diagnostic structures and the second alignment diagnostic structures, which measures a total leakage current while electrically connected to the first alignment diagnostic structures and the second alignment diagnostic structures, and which compares the total leakage current to the reference leakage current to determine if the first and second semiconductor dies pass an alignment test (i.e., if the two dies are properly or improperly aligned to each other).

Figure 9:
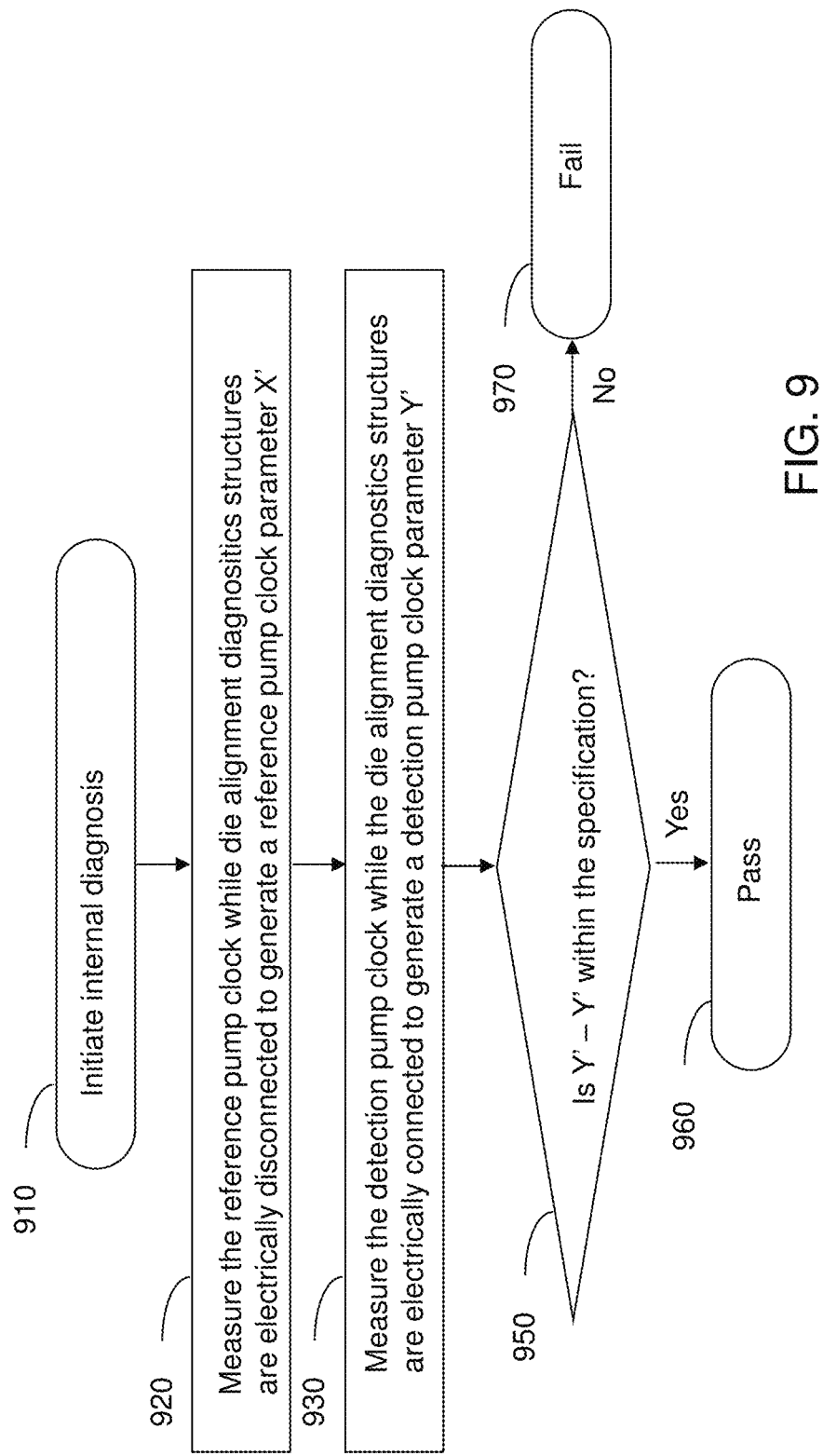
FIG. 9 is a third flow chart illustrating a third exemplary method for determining a capacitance level between a pair of aligned semiconductor dies prior to wafer bonding according to an embodiment of the present disclosure.
Figure 10:
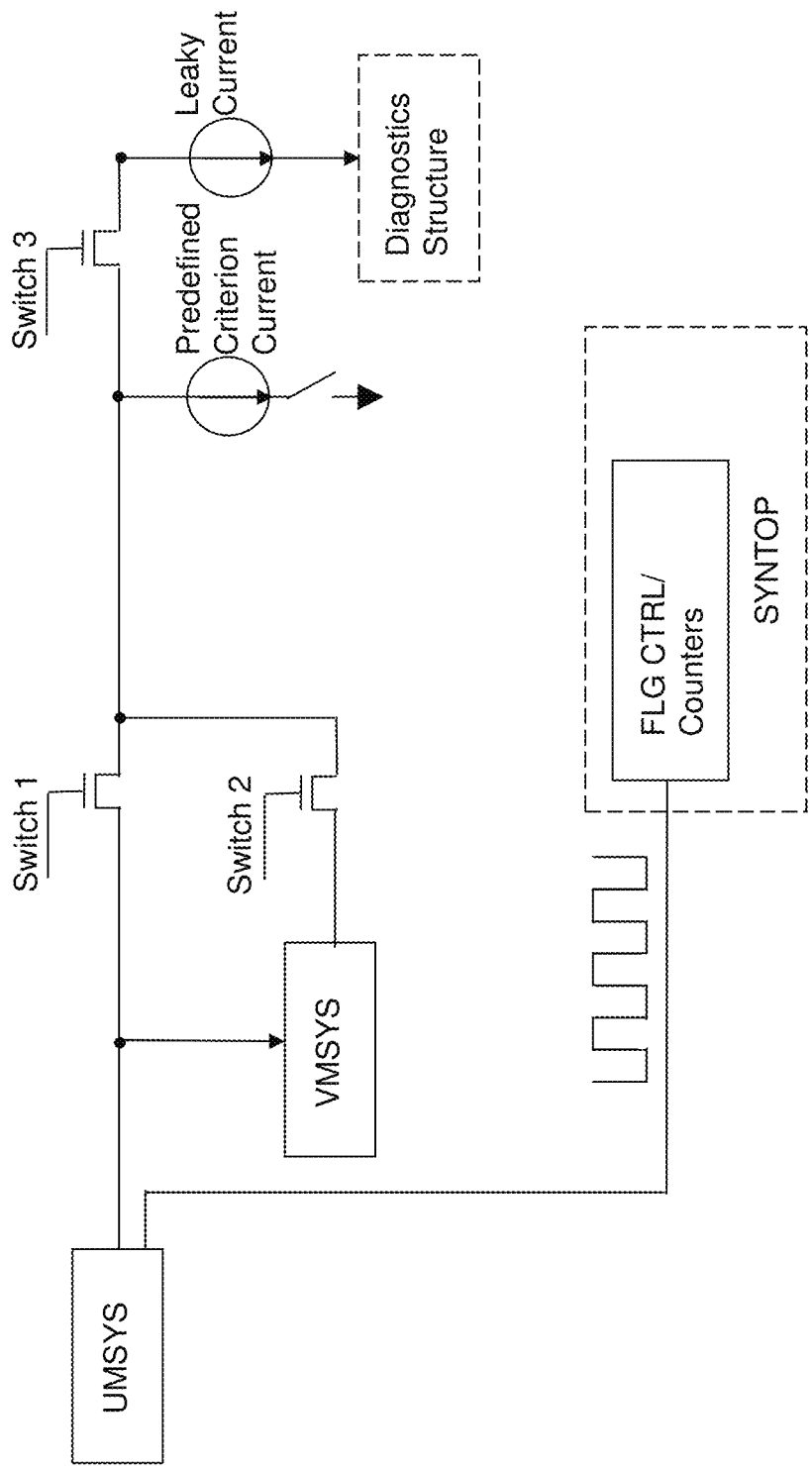
FIG. 10 is an exemplary test circuit that may be employed in conjunction with the processing steps of FIG. 9.

FIG. 9 is a third flow chart illustrating a third exemplary method for determining a leakage current between a pair of aligned semiconductor dies employing a pump clock circuit as a measurement circuit in the BIST circuit prior to wafer bonding according to an embodiment of the present disclosure. FIG. 10 is an exemplary test circuit that may be employed in conjunction with the processing steps of FIG. 9.

Referring collectively to FIGS. 9 and 10, the BIST circuit comprises a pump clock circuit configured to measure a reference pump clock rate and a detected pump clock rate, and is configured to determine a difference between the detected clock rate and the reference clock rate. The second alignment diagnostic structures 730 and the first alignment diagnostic structures 930 are electrically disconnected from the BIST circuit during measurement of the reference clock rate, and are electrically connected to the BIST circuit during measurement of the detected clock rate.

Referring to step 910 of FIG. 9, an internal diagnosis of the alignment between the first wafer 908 and the second wafer 708 is initiated. In this case, the test apparatus can issue a BIST test initiation commend to the BIST circuit within the second semiconductor die 700 of the mating pair of a first semiconductor die 900 and a second semiconductor die 700.

Referring to step 920 of FIG. 9, a reference clock rate can be measured while the first and second alignment diagnostic structures (930, 730) are electrically disconnected from the BIST circuit, and a reference clock rate parameter X' (which may be represented as an equivalent digital code) representing the reference clock rate is recorded in corresponding measurement circuit in SYN TOP illustrated in FIG. 10.

Referring to step 930 of FIG. 9, the first and second alignment diagnostic structures (930, 730) are electrically connected to the BIST circuit. The pre-defined criterion current is disabled. A leakage current flows between the first and second alignment diagnostic structures (930, 730). A detected clock rate parameter Y' (which may be represented as an equivalent digital code) representing the detected pump clock rate is recorded.

Referring to step 950 of FIG. 9, the difference between the detected clock rate parameter Y' and the reference clock rate parameter X' is calculated. If the difference is within the specification, the process flow proceeds to step 960, and the measured pair of a first semiconductor die 900 and a second semiconductor die 700 passes the measurement test. If the difference is outside the specification, the process flow proceeds to step 970, and the measured pair of a first semiconductor die 900 and a second semiconductor die 700 fails the measurement test.

In summary, in the method of FIG. 9, the BIST circuit comprises a pump clock circuit which measures a reference clock rate while electrically disconnected from the first alignment diagnostic structures and the second alignment diagnostic structures, which measures a detected pump clock rate while electrically connected to the first alignment diagnostic structures and the second alignment diagnostic structures, and which compares the detected pump clock rate to the reference pump clock rate to determine if the first and second semiconductor dies pass an alignment test.

Referring collectively to FIGS. 1A-10 and according to an aspect of the present disclosure, a bonded assembly comprising a first semiconductor die 900 and a second semiconductor die 700 is provided. The first semiconductor die 900 comprises a first substrate 908, first semiconductor devices 920 located over the first substrate 908, first metal interconnect structures 980 embedded in first dielectric material layers (290, 960), first metal bonding pads 998, and first alignment diagnostic structures 930 located at a same level as the first metal bonding pads 998. The second semiconductor die 700 comprises a second substrate 708, second semiconductor devices 720 located over the second substrate 708, second metal interconnect structures 780 embedded in second dielectric material layers 760; second metal bonding pads 798 that are bonded to the first metal bonding pads 998 by metal-to-metal bonding, and second alignment diagnostic structures 730 located at a same level as the second metal bonding pads 798. An entirety of each surface of the first alignment diagnostic structures 930 located within a bonding plane between the first semiconductor die 900 and the second semiconductor die 700 contacts a horizontal surface of the second dielectric material layers 760 (which is a consequence of passing the alignment test as described above and not contacting or causing an electrical short with the second alignment diagnostic structures 730). An entirety of each surface of the second alignment diagnostic structures 730 is located within the bonding plane contacts a horizontal surface of the first dielectric material layers 960 (which is a consequence of passing the alignment test as described above and not contacting or causing electrical short with the first alignment diagnostic structures 930).

In one embodiment, the bonded assembly comprises: first through-substrate via structures 488 vertically extending through an entire thickness of the second substrate 708 and electrically connected to a respective one of the first alignment diagnostic structures 930; and second through-substrate via structures 488 vertically extending through the entire thickness of the second substrate 708 and electrically connected to a respective one of the second alignment diagnostic structures 703.

In one embodiment, the second semiconductor die 700 further comprises a built-in-self-test (BIST) circuit configured to measure a leakage current between the second alignment diagnostic structures 730 and first alignment diagnostic structures 930.

In the embodiment of FIGS. 7 and 8, the BIST circuit comprises a current mirror circuit which is configured to measure a reference leakage current while electrically disconnected from the first alignment diagnostic structures and the second alignment diagnostic structures, which is configured to measure a total leakage current while electrically connected to the first alignment diagnostic structures and the second alignment diagnostic structures, and which is configured to compare the total leakage current to the reference leakage current to determine if the first and second semiconductor dies pass an alignment test.

In the embodiment of FIGS. 9 and 10, the BIST circuit comprises a pump clock circuit which is configured to measure a reference clock rate while electrically disconnected from the first alignment diagnostic structures and the second alignment diagnostic structures, which is configured to measure a detected pump clock rate while electrically connected to the first alignment diagnostic structures and the second alignment diagnostic structures, and which is configured to compare the detected pump clock rate to the reference pump clock rate to determine if the first and second semiconductor dies pass an alignment test.

The bonded assembly comprises through-substrate via structures 488 vertically extending through an entire thickness of the second substrate 708 and electrically connected to nodes of the BIST circuit.

In one embodiment, the first semiconductor die 900 comprises a memory die and the second semiconductor die 700 comprises a logic die comprising a peripheral circuit configured to control the memory die.

In one embodiment, the first alignment diagnostic structures 930 comprise a first array of metallic pad structures, and the second alignment diagnostic structures 730 comprise a second array of metallic pad structures that are interlaced with the first alignment diagnostic structures 930 and do not directly contact the first alignment diagnostic structures 930.

According to another embodiment of the present disclosure, measurement of current and voltage between respective diagnostic structures (930, 730) may be used to measure the overlay variation within each mating pair of a first semiconductor die 900 and a second semiconductor die 700 before and/or after bonding the die. At least one first alignment diagnostic structure 930 and two or more laterally offset second alignment diagnostic structures 730 can be configured to measure variations of current or voltage as a function of overlay variations along different horizontal directions. Thus, in one embodiment, various directional components of the overlay variation may be measured and quantified as a vector including a set of multiple scalars.

Generally, the patterns of the first alignment diagnostic structure 930 and the second alignment diagnostic structures 730 can be altered to measure current or voltage in lieu of measurement of a capacitance. For example, the first alignment diagnostic structure 930 and the second alignment diagnostic structures 730 can be configured such that the first alignment diagnostic structure 930 is configured directly contacts a corresponding first one of the second alignment diagnostic structures 730 with a maximum areal overlap when the overlay offset is zero, and the contact area between the contacting pair decreases as the overlay offset increases in any direction. Furthermore, if the first alignment diagnostic structure 930 directly contacts other second alignment diagnostic structures 730 besides the corresponding first one of the second alignment diagnostic structures 730, then the current or voltage between first alignment diagnostic structure 930 an the other second alignment diagnostic structures 730 is detected, which indicates that overlay offset is greater than zero. For example, if this current or voltage is detected, it may indicate that the overlay offset is greater than a predetermined threshold value, and that the die failed the overlay offset test. The die may then be moved relative to each other and retested, as described in the prior embodiment or if the die are already bonded, then they may be discarded.

Referring to FIGS. 11A to 11E, schematic diagrams for alignment diagnostic structures (930, 730) are illustrated for various overlay conditions. In this illustrative example, the first alignment diagnostic structure 930 comprises a first alignment metal pad configured to directly contact a central alignment diagnostic structure 730C2 comprising second alignment metal pad if the overlay offset is within a predetermined threshold value in all horizontal directions, and peripheral alignment diagnostic structures (e.g., 730C1 and 730C3 to 730C6) that laterally surround the central alignment diagnostic structure 730C2 and are configured to be electrically connected to the first alignment diagnostic structure 930 if the overlay offset exceeds the predetermined threshold value in any horizontal direction. The "good" overlay (OL) case in FIG. 11A corresponds to the case in which the overlay offset is zero. The four shifted cases in FIGS. 11B to 11E represent different horizontal directions for the overlay offset for the first alignment diagnostic structure 930 relative to the central alignment diagnostic structure 730C2.

Referring to FIGS. 12A and 12B, alternative geometries for alignment diagnostic structures (930, 730) according to embodiments of the present disclosure are illustrated. Generally, the central alignment diagnostic structure 730C2 may have a horizontal cross-sectional shape of a circle, a square, a rectangle, or a generally polygonal and/or curved shape. In some embodiments, a plurality of central alignment diagnostic structures 730C2 may be used instead of a single central alignment diagnostic structure 730C2, as shown in FIG. 12B.

Figure 13A:
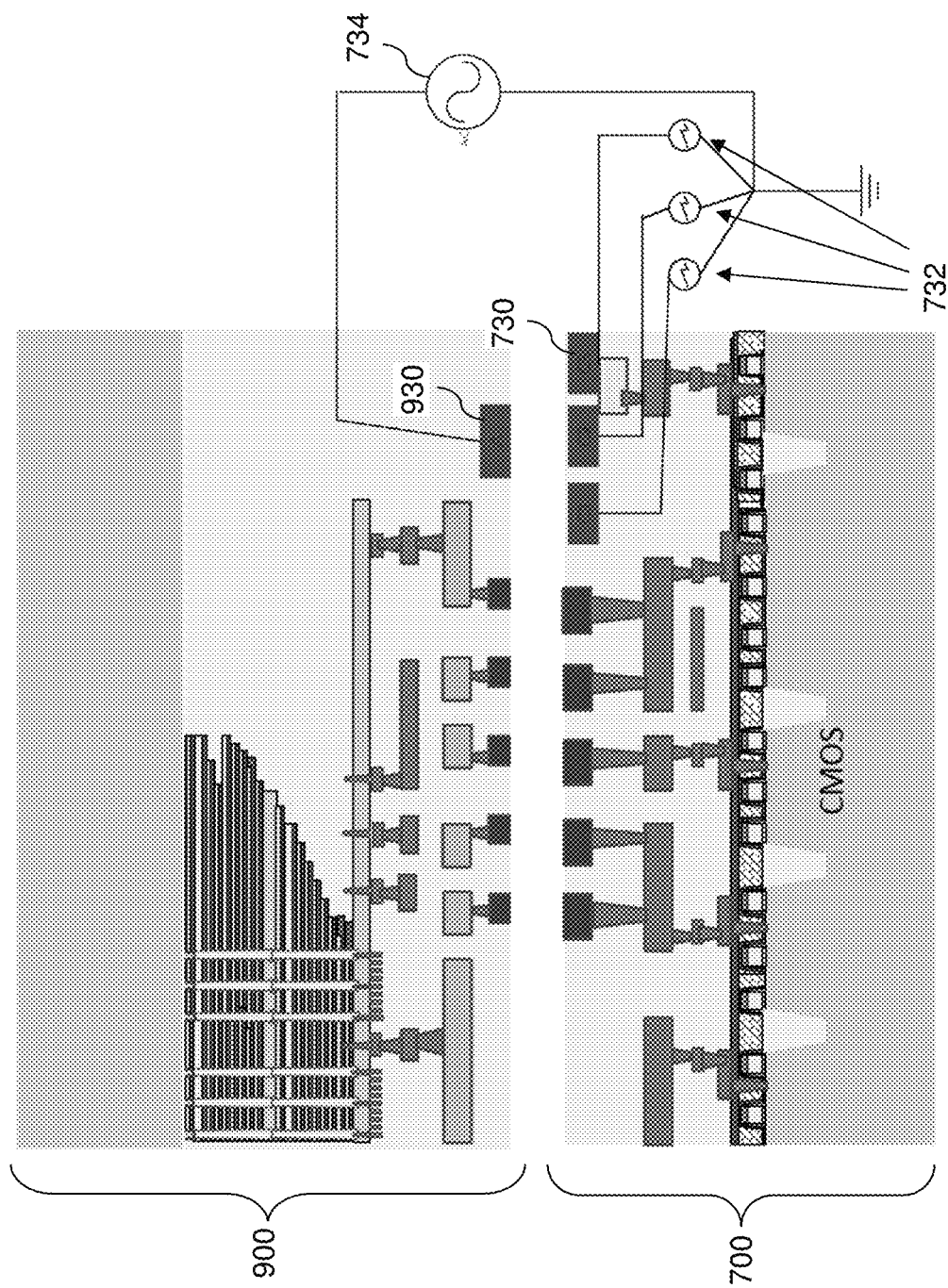
FIGS. 13A, 13B and 13C schematically illustrate vertical cross-sectional views of two die during an exemplary overlay offset measurement method according to an embodiment of the present disclosure.
Figure 13B:
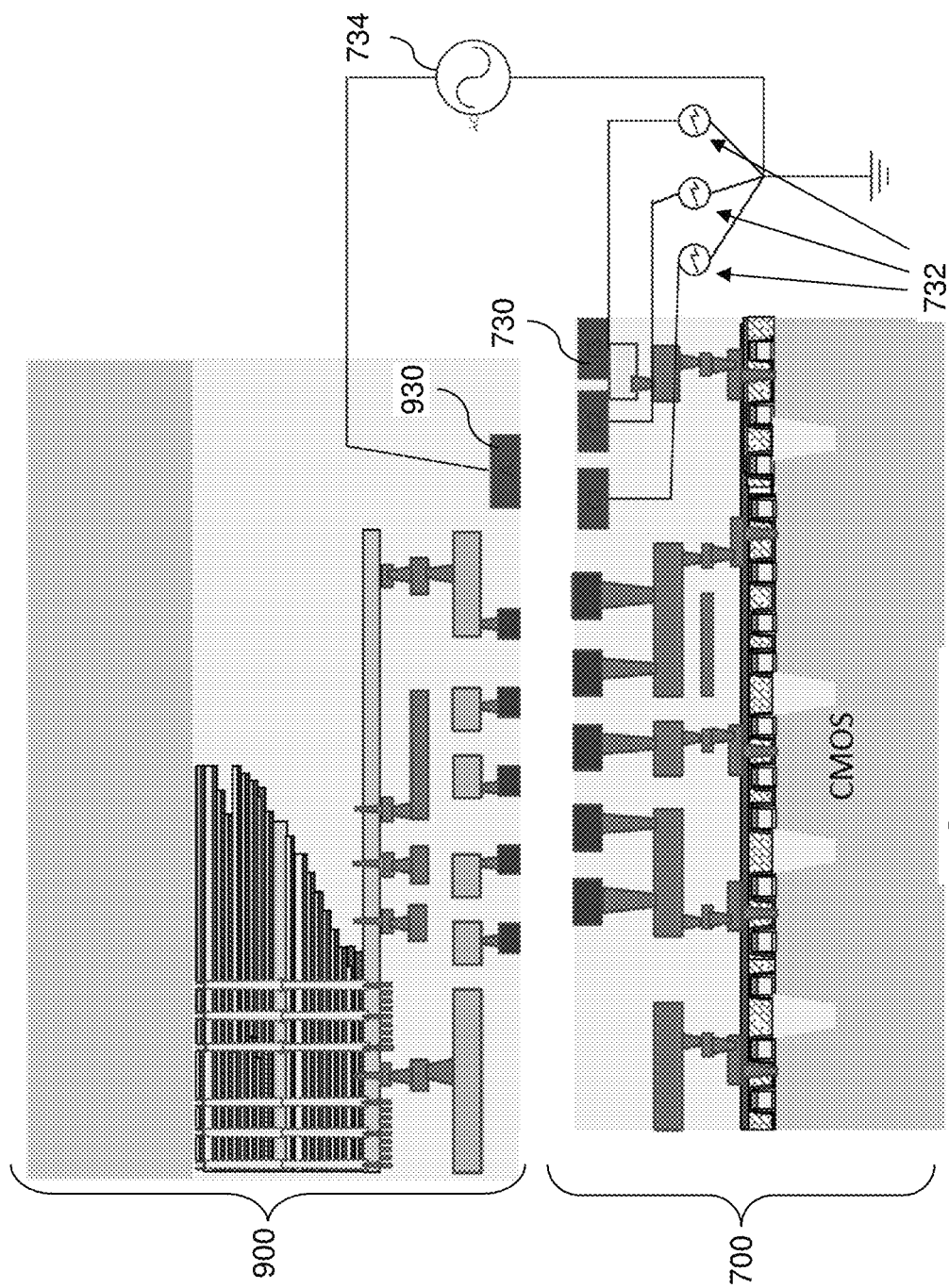
Figure 13C:
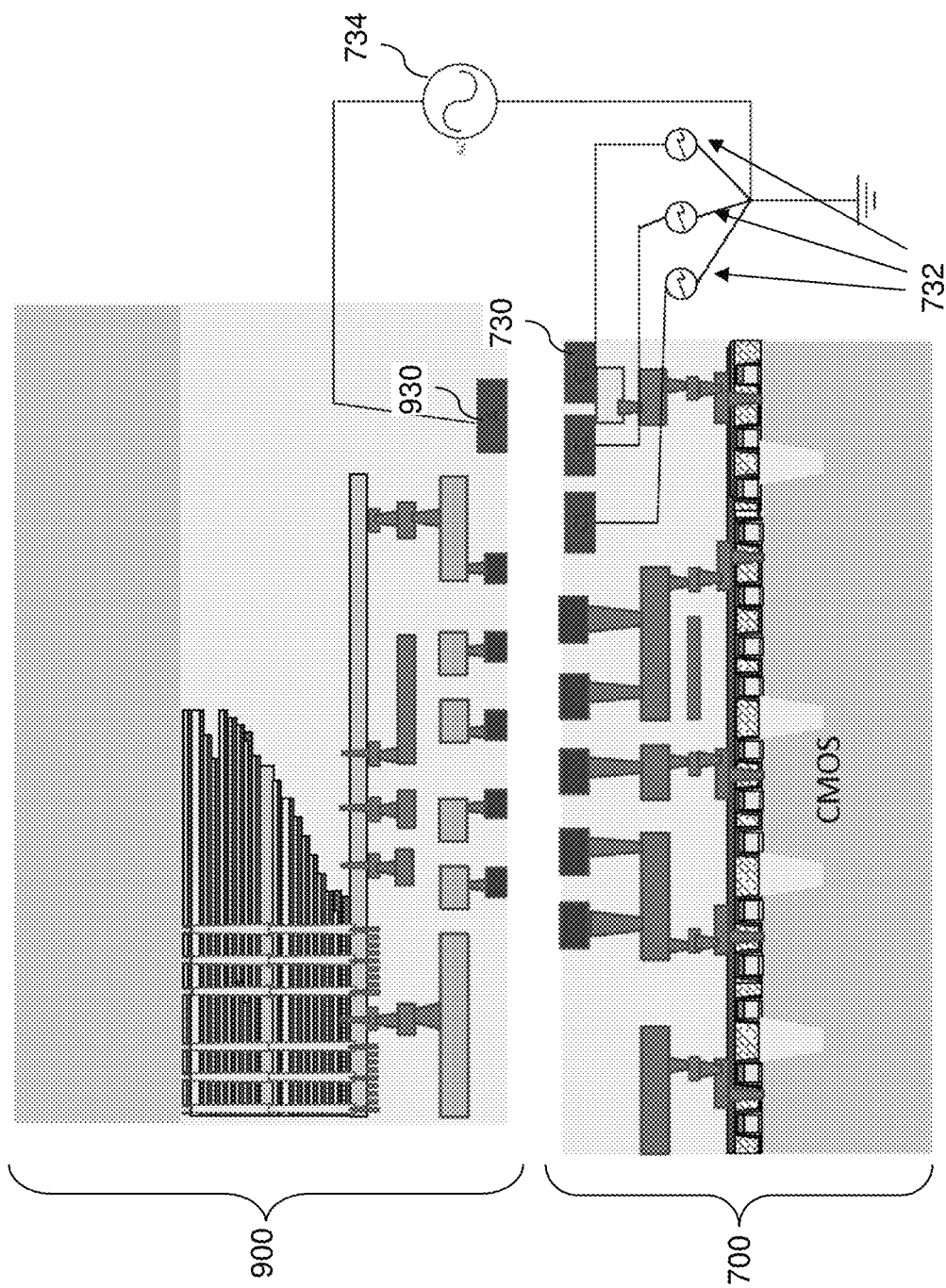

FIGS. 13A to 13C schematically illustrate vertical cross-sectional views of two die (900, 700) during exemplary wafer offset measurement method according to an embodiment of the present disclosure. The die 900 may be similar to the die 900 shown in FIG. 1A. The die 700 may be similar to the die 700 shown in FIG. 2A. In this configuration, a first alignment diagnostic structure 930 (e.g., 930A) and a plurality of second alignment diagnostic structures 730 are employed. The second alignment diagnostic structures 730 include a central alignment diagnostic structure 730C2 that contacts the first alignment diagnostic structure 930 at zero overlay offset, and a plurality of peripheral alignment diagnostic structures 730C1, 730C3 that contact the first alignment diagnostic structure 930 only when the overlay offset exceeds a predetermined threshold value (i.e., when an overlay fail occurs during the wafer alignment). The second alignment diagnostic structures 730 are electrically connected to decoders via resistors 732. The first alignment diagnostic structure 930 is connected to a power supply 734, such as an AC or DC current or voltage source. For example, one terminal (e.g., positive terminal) of the power supply 734 may be electrically connected to the first alignment diagnostic structure 930 via a lead and/or an interconnect. Another terminal (e.g., negative terminal) of the power supply 734 may be electrically connected to the second alignment diagnostic structures 730 via the resistors 732 and via another lead and/or interconnect. The resistors 732 provided as a component of decoders (e.g., current measurement circuit) that are located externally within a test apparatus, or internally within the BIST circuit.

The configuration shown in FIG. 13A corresponds to the good OL case shown in FIG. 11A. In this case, only the central alignment diagnostic structure 730C2 that contacts the first alignment diagnostic structure 930. Thus, the decoders detect only current or voltage between the central alignment diagnostic structure 730C2 and the first alignment diagnostic structure 930. The decoders do not detect current or voltage at the peripheral alignment diagnostic structures 730C1 or 730C3 to 730C6 that do not contact the first alignment diagnostic structure 930. Alternatively, an equal or substantially similar current or voltage is detected at all peripheral alignment diagnostic structures that surround the central alignment diagnostic structure 730C2. A substantially similar current or voltage is a current or voltage that differs from the other currents or voltages detected at other peripheral alignment diagnostic structures by less than a predetermined amount. In this case, the die 900 and 700 pass the overlay test and may be bonded. If the die are already bonded, then they are noted as having passed the test.

The configuration shown in FIG. 13B corresponds to the "shifted to the left" case shown in FIG. 11B. In this configuration, the first die 900 is shifted to the left and misaligned with respect to the second die 700. The decoders detect a current or voltage between a first peripheral alignment diagnostic structure 730C1 and the first alignment diagnostic structure 930 because the first peripheral alignment diagnostic structure 730C1 contacts the first alignment diagnostic structure 930. The decoders may also detect a current or voltage between the central alignment diagnostic structure 730C2 and the first alignment diagnostic structure 930 if they contact each other. In this configuration, the detected current or voltage at the first peripheral alignment diagnostic structure 730C1 is greater than the detected current or voltage at the second peripheral alignment diagnostic structure 730C3 by at least the predetermined amount. The detected current or voltage at the second peripheral alignment diagnostic structure 730C3 may be zero. In this case, the die fail the overlay test. The die may then be moved relative to each other and retested, as described in the prior embodiment or if the die are already bonded, then they may be discarded.

The configuration shown in FIG. 13C corresponds to the "shifted to the left" case shown in FIG. 11C. In this configuration, the first die 900 is shifted to the right and misaligned with respect to the second die 700. The decoders detect a current or voltage between the second peripheral alignment diagnostic structure 730C3 and the first alignment diagnostic structure 930 because the second peripheral alignment diagnostic structure 730C3 contacts the first alignment diagnostic structure 930. The decoders may also detect a current or voltage between the central alignment diagnostic structure 730C2 and the first alignment diagnostic structure 930 if they contact each other. In this configuration, the detected current or voltage at the second peripheral alignment diagnostic structure 730C3 is greater than the detected current or voltage at the first peripheral alignment diagnostic structure 730C1 by at least the predetermined amount. The detected current or voltage at the first peripheral alignment diagnostic structure 730C1 may be zero. In this case, the die fail the overlay test. The die may then be moved relative to each other and retested, as described in the prior embodiment or if the die are already bonded, then they may be discarded.

The "top", "bottom" or "diagonal" shifts shown in FIGS. 11D and 11E may be similarly detected by measuring a current or voltage between the first alignment diagnostic structure 930 and various peripheral alignment diagnostic structures 730C4, 730C5, and/or 730C6.

In some embodiments, a plurality of first alignment diagnostic structures 930 and a plurality of second alignment diagnostic structures 730 may be employed. The pattern of the plurality of first alignment diagnostic structures 930 and the plurality of second alignment diagnostic structures 730 can be selected to enable bidirectional detection of overlay offsets, i.e., detection of overlay offsets in two opposing horizontal directions. Multiple patterns of a respective plurality of first alignment diagnostic structures 930 and a respective plurality of second alignment diagnostic structures 730 to measure overlay offset along multiple horizontal directions, such as a first horizontal direction and a second horizontal direction that is perpendicular to the first horizontal direction.

Figure 14:
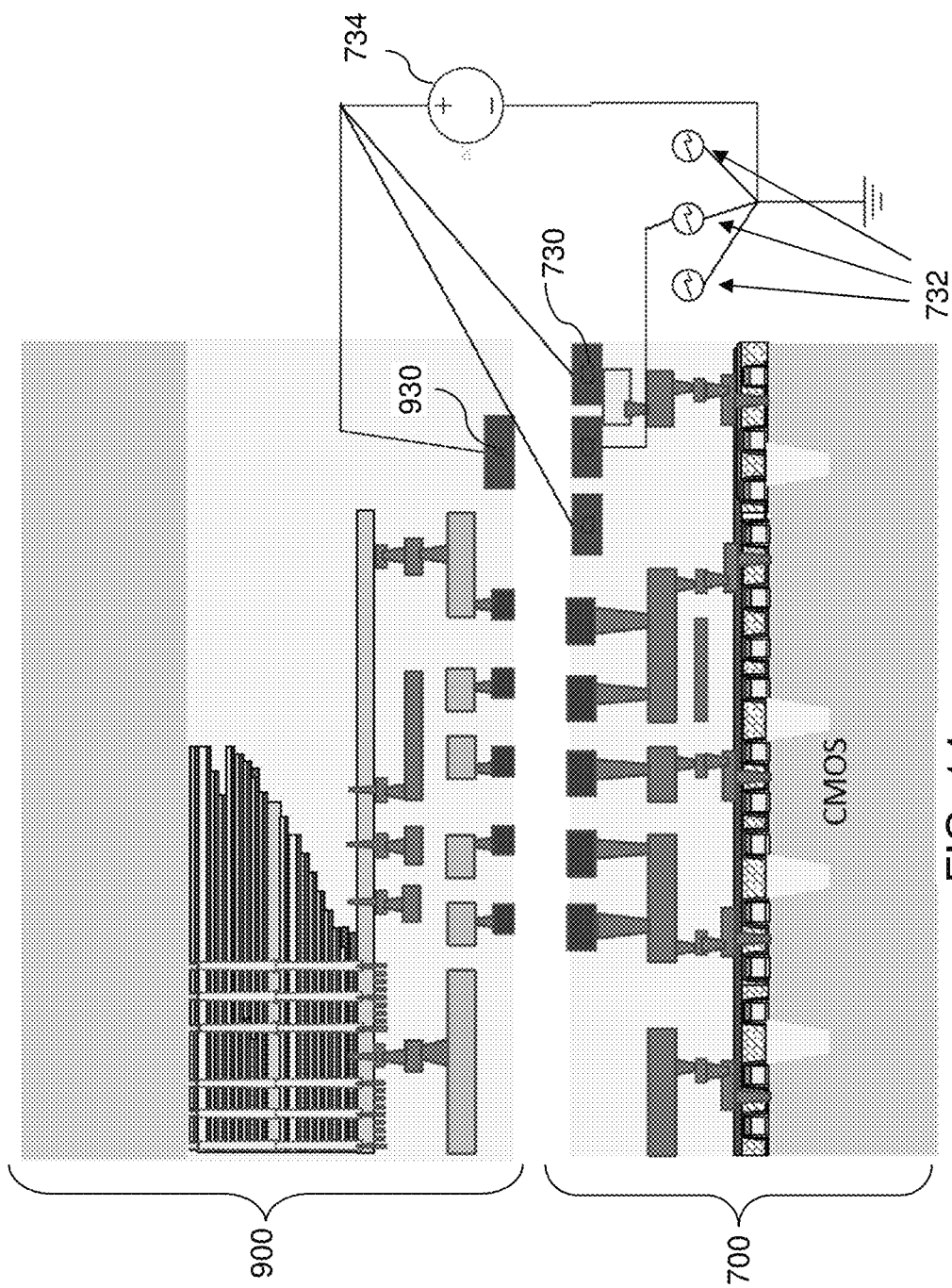
FIG. 14 schematically illustrates a vertical cross-sectional view of two die during a wafer bonding method according to an embodiment of the present disclosure.

Referring to FIG. 14, an exemplary wafer bonding method according to an embodiment of the present disclosure is illustrated. In this embodiment, currents or voltages of opposite polarities can be applied to the central alignment diagnostic structure and the peripheral alignment diagnostic structures during bonding of the first semiconductor die 900 to the second semiconductor die 700. In one configuration, the first alignment diagnostic structure 930 and the peripheral alignment diagnostic structures 730C1 and 730C3 are electrically connected to the same polarity output of the power supply 734. For example, in this embodiment, the power supply 734 may comprise a DC current or voltage supply, and the first alignment diagnostic structure 930 and the peripheral alignment diagnostic structures 730C1 and 730C3 are electrically connected to the positive output of the power supply 734. In this configuration, the same magnitude and polarity voltage is applied to both peripheral alignment diagnostic structures 730C1 and 730C3. In contrast, the central alignment diagnostic structure 730C2 is electrically connected to the opposite polarity (e.g., negative) output of the power supply 734. In this case, the pair of the first alignment diagnostic structure 930 and the central alignment diagnostic structure 730C2 are electrostatically attracted to each other due to being electrically connected to opposite polarity outputs of the power supply 734 during the alignment and bonding. In contrast, the first alignment diagnostic structure 930 and the peripheral alignment diagnostic structures 730C1 and 730C3 are electrostatically repulsed from each other due to being electrically connected to the same polarity output of the power supply 734 during the alignment and bonding. The overlay error during alignment and bonding may be reduced or eliminated due to the above electrostatic forces. Furthermore, the electrostatic forces may facilitate self-alignment of the respective die 900 and 700 to each other.

In an alternative configuration, the peripheral alignment diagnostic structures 730C1 and 730C3 may be connected to different power supplies and a different magnitude (but the same polarity) voltage is applied to the peripheral alignment diagnostic structures 730C1 and 730C3. Thus, a first voltage is applied to structure 730C1 and a second voltage is applied to structure 730C3, where the second voltage has the same polarity but a different magnitude from the first voltage. For example, +5V is applied to structure 930, +5V is applied to structure 730C1, 0V is applied to structure 730C2, and +2V is applied to structure 730C3. Since a lower positive voltage is applied to structure 730C3, it can make structure 930 shift laterally toward structure 730C3 and away from structure 730C1 if a lateral shift between the wafers is desired before or during bonding.

Figure 15:
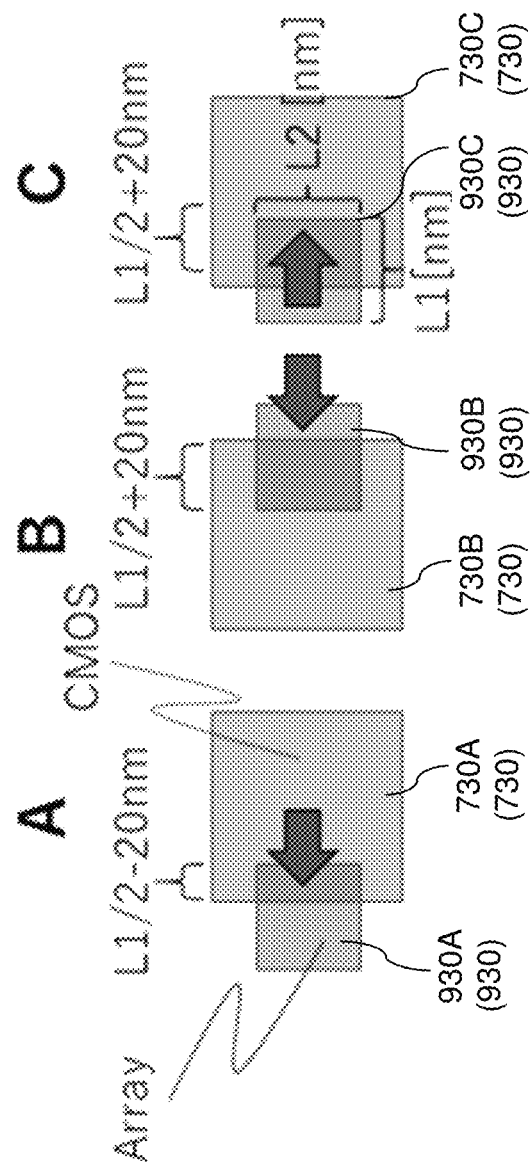
FIG. 15 is a plan view of a first electrical overlay test structure according to an embodiment of the present disclosure.

In an alternative embodiment, electrical contact resistance is used to determine the alignment between the respective die 900 and 700 (and optionally their respective wafers). FIG. 15 illustrates a plan view first exemplary electrical overlay test structure according the alternative embodiment of the present disclosure. Plural first alignment diagnostic structures 930 are provided in the first semiconductor 900, and plural second alignment diagnostic structures 730 are provided in the second semiconductor die 700. Each of the first alignment diagnostic structure 930 comprises a respective first alignment metal pad. Each of the second alignment diagnostic structure 730 comprises a respective second alignment metal pad configured to directly contact a first alignment metal pad of a respective first alignment diagnostic structure 930. For example, three second alignment diagnostic structures 730A, 730B and 730C are configured to directly respective first alignment diagnostic structure 930A, 930B and 930C to measure the contact resistance between each mating pair of a first alignment diagnostic structure 930 (e.g., 930A) and a second alignment diagnostic structure 730 (e.g., 930B). In one embodiment, each of the alignment diagnostic structures (930, 730) may have the metal alignment pad having a square horizontal cross-sectional shape. One set of alignment diagnostic structures located within one wafer may have smaller sizes relative to another set of alignment diagnostic structures located within another wafer. For example, metal alignment pads located within a first semiconductor die (such as a memory die) 900 may be smaller than metal alignment pads located within a second semiconductor die (such as a CMOS die) 700.

In the illustrated example, the metal alignment pads in the first semiconductor die 900 may have a first length L1 along a first horizontal direction and a second length L2 along a second horizontal direction. Mating pairs of a respective first alignment diagnostic structure 930 and a respective second alignment diagnostic structure 730 can be laterally offset in opposite directions. For example, first alignment diagnostic structures 930A and 930C in respective patterns A and C may be located at and overlap the first (e.g., left) edge of the respective second alignment diagnostic structures 730A and 730C. In contrast, the first alignment diagnostic structure 930B in pattern B may be located at and overlap the opposite second (e.g., right) edge of the respective second alignment diagnostic structure 730B. Furthermore, the first alignment diagnostic structures 930A and 930B in respective patterns A and B may be laterally offset by a negative length "−X" (e.g., −20 nm) along a first horizontal direction, and a first alignment diagnostic structure 930C in pattern C may be laterally offset by a positive length "+X" (e.g., +20 nm) along the first horizontal direction. Due to the offsets, the vertical overlap length equals to L2 and does not change, but the horizontal overlap distance for pattern A is L1/2−20 nm and for patterns B and C is L1/2+20 nm, where X=20 nm in this example.

The values for the contact resistance of patterns A, B, and C under the condition of zero overlay offset are given by: RcA0=Rck/(L1/2−20)/L2 for pattern A, RcB0=Rck/(L1/2+20)/L2 for pattern B, and RcC0=Rck/(L1/2+20)/L2 for pattern C, in which Rck is the contact resistivity for a metal-to-metal contact between a contacting pair of metal alignment pads, RcA0 is the value of the contact resistance for pattern A, RcB0 is the value of the contact resistance for pattern B, and RcC0 is the value of the contact resistance for pattern C. L1 and L2 are measured in units of nm in this case.

Figure 16:
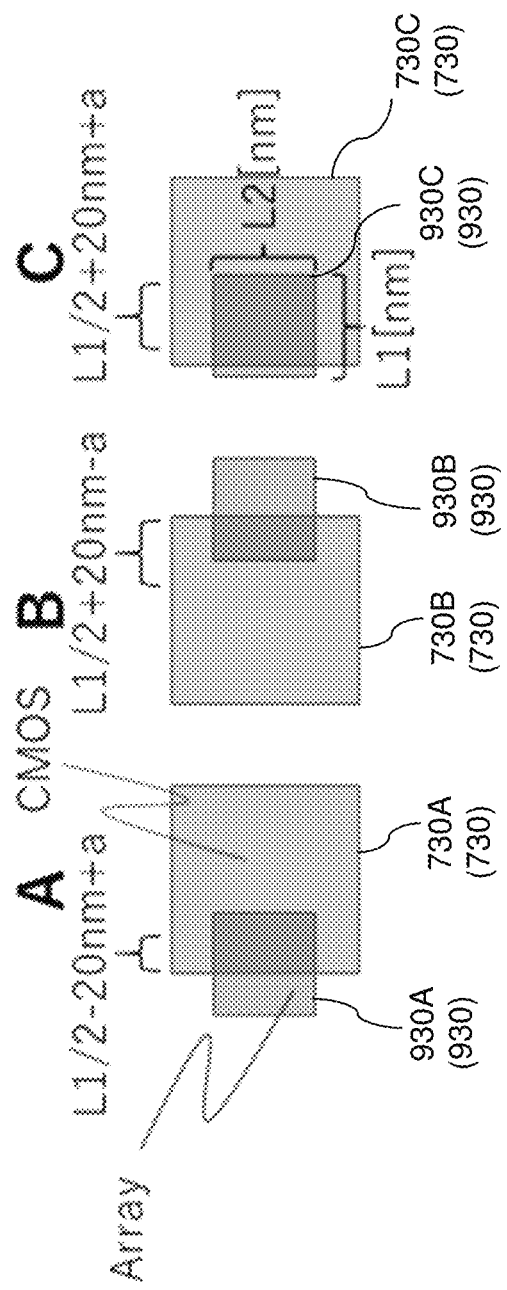
FIG. 16 is a plan view of a second electrical overlay test structure according to an embodiment of the present disclosure.

FIG. 16 illustrates a case in which an overlay offset "a" is introduced during alignment between the first wafer and the second wafer (e.g., between the first and second semiconductor dies). The values for the contact resistance of patterns A, B, and C under the condition an overlay offset of a along the first horizontal direction are given by: RcA=Rck/(L1/2−20+a)/L2 for pattern A, RcB=Rck/(L1/2+20−a)/L2 for pattern B, and RcC=Rck/(L1/2+20+a)/L2 for pattern C, in which Rck is the contact resistivity for a metal-to-metal contact between a contacting pair of metal alignment pads, RcA is the value of the contact resistance for pattern A, RcB is the value of the contact resistance for pattern B, and RcC is the value of the contact resistance for pattern C. L1 and L2 are measured in units of nm in this case. Upon solving the set of three equations for a, the overlay offset a (in units of nm) is given by:

$$a = 20 \times \frac{RcA(RcB - RcC)}{RcB(RcA - RcC)}.$$

If the absolute value of X is a different length than 20 nm, then the value of X is inserted into the above formula instead of "20".

Figure 17A:
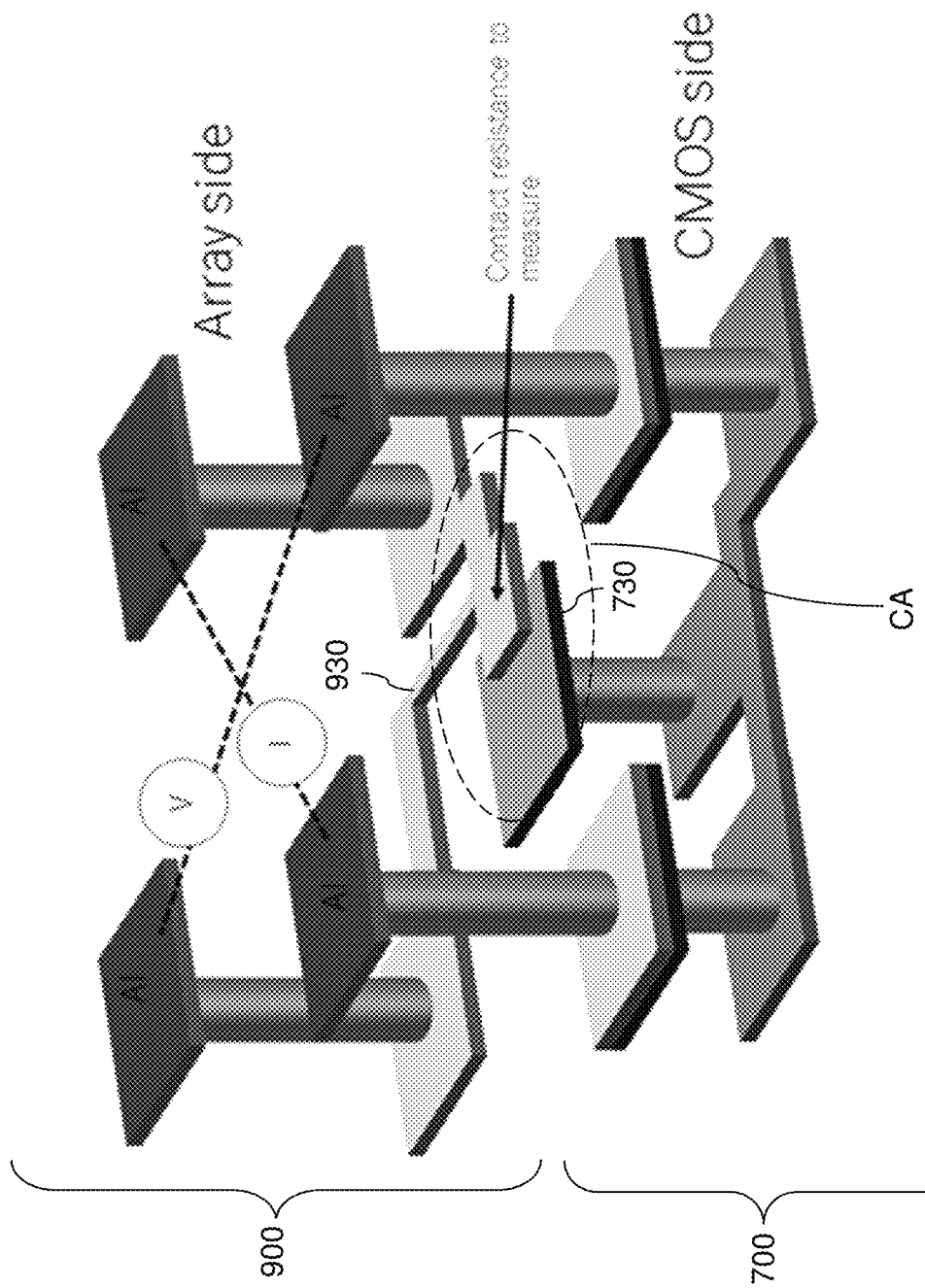
FIG. 17A is a perspective view of alignment diagnostic structures comprising a cross-bridge Kelvin structure according to an embodiment of the present disclosure.
Figure 17B:
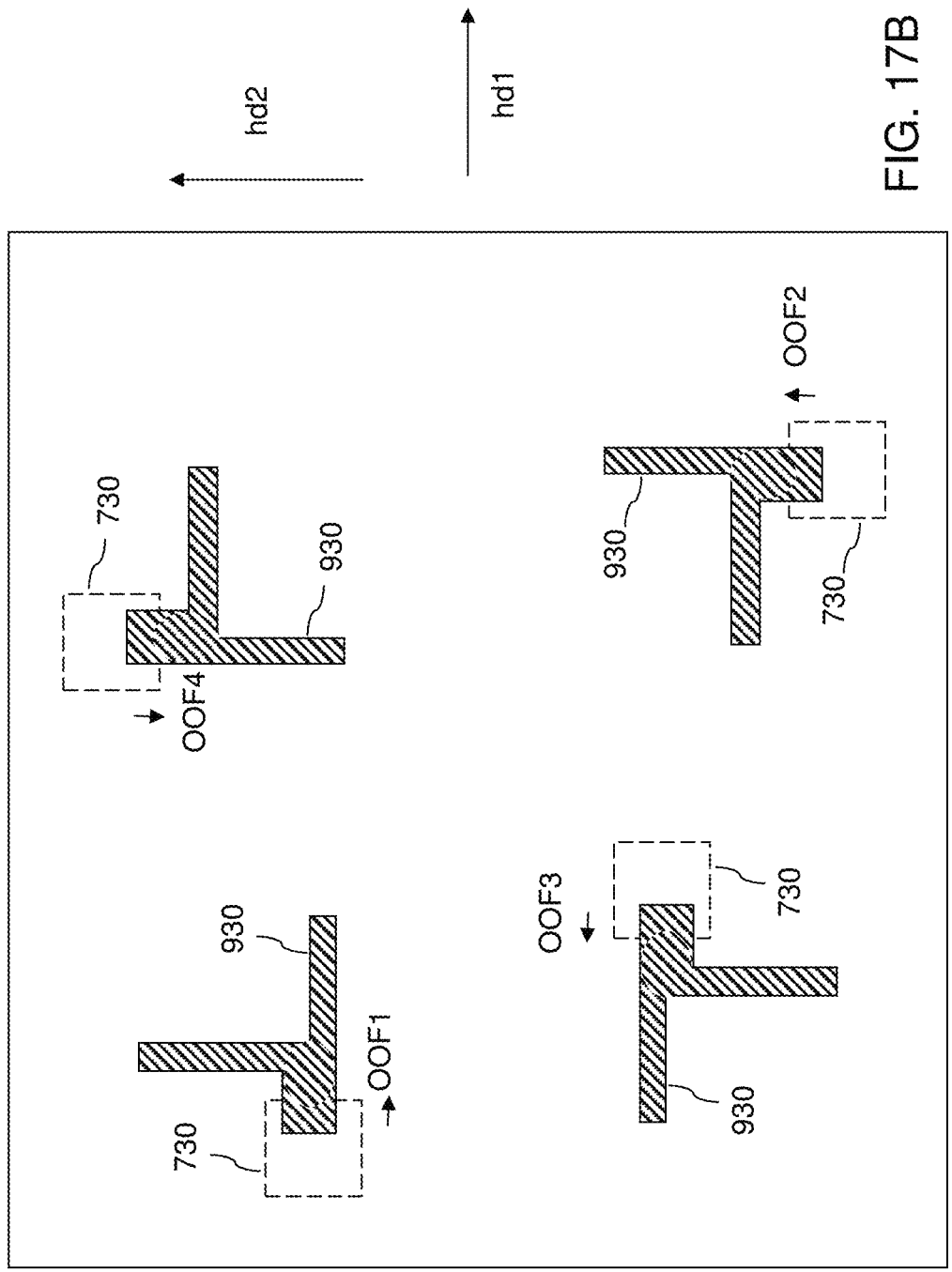
FIG. 17B is a plan view of a set of alignment diagnostic structures provided across a mating pair of a first semiconductor die and a second semiconductor die according to an embodiment of the present disclosure.

Referring to FIGS. 17A and 17B, alignment diagnostic structures comprising a cross-bridge Kelvin structure are illustrated. Generally, a set of alignment diagnostic structures can be provided across each mating pair of a first semiconductor die 900 and a second semiconductor die 700 according to an embodiment of the present disclosure. The set of alignment diagnostic structures can include first alignment diagnostic structures 930 and second alignment diagnostic structures 730 that collectively constitute a cross-bridge Kelvin structure. Generally, the contact resistance between mating pairs of metal alignment pads is small compared with parasitic resistance of metal interconnect structures and probe pins. The cross-bridge Kelvin structure can be effectively employed in order to measure only the contact resistance between a contacting pair of a first alignment diagnostic structure 930 and a second alignment diagnostic structure 730.

In one embodiment, a plurality of cross-bridge Kelvin structures can be employed (for example, as illustrated in FIG. 17B) to measure overlay offset in different horizontal directions. For example, a first overlay offset OOF1 can be measured along a first horizontal direction hd1, a second overlay offset OOF2 can be measured along a second horizontal direction hf2 that is perpendicular to the first horizontal direction hd1, a third overlay offset OOF3 can be measured along a direction that is antiparallel to the first horizontal direction hd1, and a fourth overlay offset OOF4 can be measured along a direction that is antiparallel to the fourth horizontal direction hd2.

The exemplary alignment diagnostic structures (930, 730) of the present disclosure can have an areal overlap with first metal interconnect structures 980 and/or second metal interconnect structures 780 because transmission of an infrared beam through a substrate is not necessary for the wafer alignment method of the present disclosure. The alignment diagnostic structures (930, 730) of the embodiments of the present disclosure may be positioned in any area within a semiconductor die. In contrast, infrared overlay measurement structures known in the art require placement within an area that does not include any metal interconnect structures therein. Thus, placement of the alignment diagnostic structure over the metal interconnect structures results in an inspection error during an infrared overlay measurement.

The alignment diagnostic structures (930, 730) of the embodiments of the present disclosure enables electrical overlay inspection for wafer bonding without use of optical alignment methods, although optical alignment methods may be employed in conjunction with the alignment methods of the present disclosure. The wafer alignment methods of the embodiments of the present disclosure can be employed concurrent with a die sort yield test.

Referring to FIGS. 11A to 17B, and according to various embodiments of the present disclosure, a method of comprises providing a first wafer 908 including a first two-dimensional array of first semiconductor dies 900, wherein each of the first semiconductor dies comprises a respective set of first metal bonding pads 998 and at least one first alignment diagnostic structure 930 located at a same level as the first metal bonding pads, providing a second wafer 708 including a second two-dimensional array of second semiconductor dies 700, wherein each of the second semiconductor dies comprises a respective set of second metal bonding pads 788 and a respective set of second alignment diagnostic structures 730 located at a same level as the second metal bonding pads, overlaying the first wafer and the second wafer, measuring at least one of a current, voltage or contact resistance between the first alignment diagnostic structures and the second alignment diagnostic structures for multiple mating pairs of the first semiconductor dies and the second semiconductor dies to determine an overlay offset between the mating pairs of the first semiconductor dies and the second semiconductor dies, and bonding the second wafer to the first wafer.

In one embodiment illustrated in FIGS. 11A to 13C, the at least one first alignment diagnostic structure 930 comprises a first alignment diagnostic structure (e.g., 930A), and the respective set of second alignment diagnostic structures comprises a central alignment diagnostic structure 730C2 and peripheral alignment diagnostic structures 730C1 and 730C3-730C6 that surround the central alignment diagnostic structure.

In one embodiment, the overlay offset does not exceed a predetermined threshold value in any horizontal direction and the mating pairs of the first semiconductor dies 900 and the second semiconductor dies 700 pass an overlay offset test, if the first alignment diagnostic structure 930 contacts the central alignment diagnostic structure 730C2, and an equal or substantially similar current or voltage is detected at all peripheral alignment diagnostic structures 730C1 and 730C3-730C6. In contrast, the overlay offset exceeds the predetermined threshold value in at least one horizontal direction and the mating pairs of the first semiconductor dies and the second semiconductor dies fail an overlay offset test, if the first alignment diagnostic structure 930 does not contact the central alignment diagnostic structure 730C2, or if the detected current or voltage at one of the peripheral alignment diagnostic structures is different than the detected current or voltage at another one of the peripheral alignment diagnostic structures by at least a predetermined amount.

In one embodiment of FIGS. 11A-13C, the step of measuring at least one of the current, voltage or contact resistance comprises measuring at least one of the current or voltage, and the step of bonding the second wafer to the first wafer occurs after the step of measuring.

In one embodiment, the method further comprises changing a lateral overlay or a relative azimuthal angle at least once between the second wafer and the first wafer if the mating pairs of the first semiconductor dies and the second semiconductor dies fail the overlay offset test; and performing at least one additional step of measuring at least one of the current or voltage after the step of changing the lateral overlay or the relative azimuthal angle.

In another embodiment of FIGS. 15-17B, the step of measuring at least one of the current, voltage or contact resistance comprises measuring the contact resistance, and the step of bonding the second wafer to the first wafer occurs before the step of measuring. In this embodiment, the first alignment diagnostic structures 930 and the second alignment diagnostic structures 730 are connected in a crossbridge Kelvin pattern.

In one embodiment shown in FIGS. 15 and 16, the at least one first alignment diagnostic structure 930 comprises a plurality of first alignment diagnostic structures, and the respective set of second alignment diagnostic structures 730 comprises a plurality of the alignment diagnostic structures which have a larger area than the respective plurality of first alignment diagnostic structures. The first alignment diagnostic structures 930 located in respective first and third patterns (A and C) overlap a first edge of respective second alignment diagnostic structures 730, and at least one first alignment diagnostic structure in a second pattern (B) overlaps an opposite second edge of respective second alignment diagnostic structures. The first alignment diagnostic structures 930 located in the first and the second patterns (A and B) are laterally offset by a negative length along a first horizontal direction, and the first alignment diagnostic structure 930 in the third pattern (C) is laterally offset by a positive length along the first horizontal direction. In one embodiment, the method also includes determining the overlay offset based on the step of measuring the contact resistance.

In one embodiment, the first semiconductor die 900 comprises a memory die and the second semiconductor die 700 comprises a logic die comprising a peripheral circuit configured to control the memory die.

Referring to FIG. 14, and according to the corresponding embodiment of the present disclosure, a method of bonding a first wafer 908 and a second wafer 708 comprises providing the first wafer including a first two-dimensional array of first semiconductor dies 900, wherein each of the first semiconductor dies comprises a respective set of first metal bonding pads 998 and a first alignment diagnostic structure 930 located at a same level as the first metal bonding pads, providing the second wafer including a second two-dimensional array of second semiconductor dies 700, wherein each of the second semiconductor dies comprises a respective set of second metal bonding pads 798 and a respective set of second alignment diagnostic structures 730 comprising a central alignment diagnostic structure 730C2 and peripheral alignment diagnostic structures (730C1, 730C3) that surround the central alignment diagnostic structure, wherein the second alignment diagnostic structures are located at a same level as the second metal bonding pads, overlaying the first wafer and the second wafer, applying opposite polarity current or voltage between the first alignment diagnostic structure 930 and the central alignment diagnostic structure 730C2 to electrostatically attract the first alignment diagnostic structure and the central alignment diagnostic structure, applying a same polarity current or voltage between the first alignment diagnostic structure 930 and the peripheral alignment diagnostic structures (730C1, 730C3) to electrostatically repel the first alignment diagnostic structure from the peripheral alignment diagnostic structure, and bonding the second wafer to the first wafer. In one embodiment, the steps of applying the opposite polarity current or voltage and applying the same polarity current or voltage occur at the same time.

Referring to FIGS. 15-17B, and according to the corresponding embodiment of the present disclosure a bonded assembly comprises a first semiconductor die 900 and a second semiconductor die 700. The first semiconductor die comprises first semiconductor devices 920, first metal bonding pads 998 located on a front surface of the first semiconductor die, and first alignment diagnostic structures 930 located at a same level as the first metal bonding pads. The second semiconductor die 700 comprises second semiconductor devices 720, second metal bonding pads 798 that are located on a front surface of the second semiconductor die and bonded to the first metal bonding pads by metal-to-metal bonding, and second alignment diagnostic structures 730 located at a same level as the second metal bonding pads. The first alignment diagnostic structures 930 and the second alignment diagnostic structures 730 are connected in a cross-bridge Kelvin pattern (also known as a cross-bridge Kevin resistor (CBKR)).

In one embodiment illustrated in FIGS. 17A and 17B, the first alignment diagnostic structures 930 comprise a respective tab portion that laterally protrudes along different horizontal directions and contacts and overlies an edge of a respective one of the second alignment diagnostic structures 730.

In one embodiment, each of the first alignment diagnostic structures 730 is electrically connected to a respective first electrical node of a built-in-self-test (BIST) circuit through a respective first electrically conductive path, each of the second alignment diagnostic structures is electrically connected to a respective second electrical node of the BIST circuit through a respective second electrically conductive path. The BIST circuit is configured to measure a contact resistance between the first alignment diagnostic structures and the second alignment diagnostic structures.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A method of bonding a first wafer and a second wafer, comprising:

providing a first wafer including a first two-dimensional array of first semiconductor dies, wherein each of the first semiconductor dies comprises a respective set of first metal bonding pads and a first alignment diagnostic structure located at a same level as the first metal bonding pads;

providing a second wafer including a second two-dimensional array of second semiconductor dies, wherein each of the second semiconductor dies comprises a respective set of second metal bonding pads and a respective set of second alignment diagnostic structures comprising a central alignment diagnostic structure and peripheral alignment diagnostic structures that surround the central alignment diagnostic structure, wherein the second alignment diagnostic structures are located at a same level as the second metal bonding pads;

overlaying the first wafer and the second wafer;

applying opposite polarity current or voltage between the first alignment diagnostic structure and the central alignment diagnostic structure to electrostatically attract the first alignment diagnostic structure and the central alignment diagnostic structure;

applying a same polarity current or voltage between the first alignment diagnostic structure and the peripheral alignment diagnostic structures to electrostatically repel the first alignment diagnostic structure from the peripheral alignment diagnostic structure; and bonding the second wafer to the first wafer.

2. The method of claim 1, wherein the applying the opposite polarity current or voltage and applying the same polarity current or voltage occur at the same time.

3. The method of claim 1, wherein the first semiconductor die comprises a memory die and the second semiconductor die comprises a logic die comprising a peripheral circuit configured to control the memory die.

\* \* \* \* \*